(12) United States Patent
Ito et al.

(10) Patent No.: US 6,580,171 B2
(45) Date of Patent: Jun. 17, 2003

(54) SEMICONDUCTOR WIRING DEVICE

(75) Inventors: Sachiyo Ito, Yokohama (JP); Masahiko Hasunuma, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/085,067

(22) Filed: Mar. 1, 2002

(65) Prior Publication Data

US 2002/0130421 A1 Sep. 19, 2002

Related U.S. Application Data

(63) Continuation of application No. 09/531,011, filed on Mar. 20, 2000, now Pat. No. 6,414,394.

(30) Foreign Application Priority Data

Mar. 19, 1999 (JP) .............................. 11-075097

(51) Int. Cl.[7] .................. H01L 23/522; H01L 23/52
(52) U.S. Cl. .................. 257/760; 257/758; 257/759
(58) Field of Search .................. 257/734, 758–760

(56) References Cited

U.S. PATENT DOCUMENTS

| | | | |
|---|---|---|---|
| 5,229,336 A | 7/1993 | Akiyama et al. | 501/56 |
| 5,945,203 A | 8/1999 | Soane | 428/209 |
| 6,037,668 A | 3/2000 | Cave et al. | 257/784 |
| 6,218,735 B1 | 4/2001 | Annapragada | 257/758 |
| 6,232,656 B1 | 5/2001 | Yabu et al. | 257/690 |
| 6,291,877 B1 * | 9/2001 | Usami et al. | 257/679 |

FOREIGN PATENT DOCUMENTS

JP  7-326671  12/1995

OTHER PUBLICATIONS

Nakata et al., "New Low k Material "LKD™" for Al Damascene Process Application", Extended Abstracts of the 1999 International Conference on Solid State Devices and Materials, Tokyo, pp. 506–507, (1999).

* cited by examiner

Primary Examiner—Allan R. Wilson
(74) Attorney, Agent, or Firm—Finnegan, Henderson, Farabow, Garrett & Dunner, L.L.P.

(57) ABSTRACT

A semiconductor device is structured to include a wiring made of Al, a first insulation film made of silicon oxide including an organic content formed in contact with an upper surface of the wiring, and a second insulation film formed in contact with an upper surface of the first insulation film and made of an F-added $SiO_2$ film having a higher Young's modulus than that of the first insulation film. The wiring has a film thickness $d_M$ of 400 nm, the first insulation film has a film thickness $d_s$ of 400 nm, and the second insulation film has a film thickness $d_h$ of 10 nm.

36 Claims, 7 Drawing Sheets

SEMICONDUCTOR WIRING DEVICE

CROSS-REFERENCE TO RELATED APPLICATIONS

This is a continuation of application Ser. No. 09/531,011, filed Mar. 20, 2000, now U.S. Pat. No. 6,414,394 which is incorporated herein by reference.

This application is based upon and claims the benefit of priority from the prior Japanese Patent Application No. 11-075097, filed Mar. 19, 1999, the entire contents of which are incorporated herein by reference.

BACKGROUND OF THE INVENTION

The present invention relates to a semiconductor device having a multilayer structure of an LSI, and relates, more particularly, to a semiconductor device having a multilayer structure for achieving high reliability of wiring.

A defect of electromigration (hereinafter to be referred to as EM) that has a most serious problem in LSI wiring occurs in the following mechanism. A metal atom forming a wiring shifts from a cathode (−) side to an anode (+) side. In this case, tensile stress is accumulated at the cathode side of the wiring as the density of the metal atom decreases. When the tensile stress exceeds a critical stress, a void is generated, and this breaks the wiring.

The stress of the wiring can be reduced to minimize the occurrence of the EM when an insulation film surrounding the wiring receives the stress from the wiring so that the insulation film can be deformed. However, according to a conventional semiconductor device, both a plasma $SiO_2$ film and a plasma SiN film that have been used for interlayer insulation films have a relatively large Young's modulus of 50 GPa or above. These films are not deformed to a noticeable level when they receive stress. Therefore, the EM resistance has been low in the conventional semiconductor devices.

In some conventional semiconductor devices, insulation films having low Young's modulus are formed in contact with the wiring. However, in this case, there arises a problem in crack resistance, water absorbing power, water permeability and the like.

As explained above, according to the conventional semiconductor devices, the Young's modulus of the insulation films formed in contact with the wiring have been high, and thus, the insulation films are not deformed to a noticeable level when the insulation films have received stress. Therefore, the EM resistance has been low in these semiconductor devices. Further, in the case of a semiconductor device having high EM resistance with a structure that insulation films of low Young's modulus are formed in contact with the wiring, there occurs a problem in crack resistance, water absorbing power, and water permeability.

BRIEF SUMMARY OF THE INVENTION

It is an object of the present invention to provide a semiconductor device with improved EM resistance while keeping crack resistance of interlayer insulation films.

In order to achieve the above object, according to one aspect of the invention, as shown in FIG. 7A, there is provided a semiconductor device including a wiring, a first insulation film formed in contact with at least one surface of this wiring, and a second insulation film formed on the first insulation film in contact with the first insulation film and having a higher Young's modulus than that of the first insulation film, wherein when the wiring, the first insulation film and the second insulation film have coefficients of linear thermal expansion αM, αs and αh respectively, Young's moduli EM, Es and Eh respectively, and film thickness dM, ds and dh respectively, and when coefficients determined by materials that structure the wiring are expressed as k1, k2, when it is defined that dI=ds+dh, EI=(dsEs+dhEh)/dI, and αI=(dsαs+dhαh)/dI, and also when a gradient of the stress working on the wiring depending on temperature is expressed as s, the wiring, the first insulation film and the second insulation film respectively satisfy a condition given by the following Expression (1):

$$s = k_1 \frac{E_M E_I}{E_M + E_I} \cdot \left( \alpha_M - k_2 \alpha_I \frac{d_I}{d_M} \right)$$

Further, according to another aspect of the invention, as shown in FIG. 7B, there is provided a semiconductor device including a substrate, a first insulation film formed on the substrate through at least an insulation layer, a first wiring, a second wiring and a third wiring selectively formed on the first insulation film, and a second insulation film formed on the first insulation film in contact with the first insulation film and having a higher Young's modulus than that of the first insulation film, wherein the first wiring, the second wiring and the third wiring are formed on mutually different layers of the first insulation film, and when the first to the third wirings, the first insulation film and the second insulation film have coefficients of linear thermal expansion αM, αs and αh respectively, Young's moduli EM, Es and Eh respectively, when a sum of film thickness of the first to the third wirings, a film thickness of the first insulation film and a film thickness of the second insulation film are expressed as dM, ds and dh respectively, when coefficients determined by materials that structure the first to the third wirings are expressed as k1, k2, when it is defined that dI=ds+dh, EI=(dsEs+dhEh)/dI, and αI=(dsαs+dhαh)/dI, and also when a gradient of the stress working on the first to the third wirings depending on temperature is expressed as s, the first to the third wirings, the first insulation film and the second insulation film respectively satisfy a condition given by the following Expression (2):

$$s = k_1 \frac{E_M E_I}{E_M + E_I} \cdot \left( \alpha_M - k_2 \alpha_I \frac{d_I}{d_M} \right)$$

In FIG. 7B, film thickness of the first wiring is expressed as dH1, that of the second wiring is expressed as dH2, and that of the third wiring is expressed as dH3. So the sum of film thickness of the first to the third wirings dM equals to (dH1+dH2+dH3).

A current density coefficient n that is known as one of parameters of the reliability of EM resistance is a yardstick for expressing the reliability of EM resistance, like MTF (Mean Time to Failure) and activation energy. When the n-value is larger, the reliability of EM resistance is higher. In the conventional semiconductor device, when only one layer of an insulation film is formed in contact with the wiring, and when the insulation film is not deformed by the stress received from the wiring, the n-value is ideally determined as two. This value is obtained from a time taken (incubation time) before the resistance starts to increase due to the EM. This n-value will never take a larger value than two.

On the other hand, when a coefficients of linear thermal expansion of the insulation film is constant, it is considered that the smaller a gradient s-value of the stress working on the wiring depending on temperature is, the larger an effect of reduction in the stress due to the deformation of the insulation film is. This stress reduction effect is similarly obtained when a stress is generated in the wiring due to EM, as well as when a thermal stress is generated.

When a wiring is surrounded by an insulation film, the gradient of the stress working on the wiring depending on temperature is usually expressed by the following expression.

$$s = d\sigma/dT = EM \times (\alpha M - \alpha I)$$

However, this expression applies to a case where the insulation film is not deformed by the stress received from the wiring. A TEOS-SiO$_2$ film and an SiN film that are used as an interlayer insulation film have a high Young's modulus of 50 GPa respectively, and their coefficients of linear thermal expansion are not larger than one-tenth of that of Al. Therefore, a negligibly small volume of deformation occurs in the insulation film due to the stress received from the wiring.

When an insulation film having a Young's modulus not higher than 15 GPa is used around the wiring, the insulation film is deformed by the stress received from the wiring. The stress of this wiring decreases based on this deformation. In this case, a gradient of the stress working on the wiring depending on temperature is given by the following Expression (3).

$$s = \frac{d\sigma}{dT} = k_1 \frac{E_M E_I}{E_M + E_I} \cdot \left( \alpha_M - k_2 \alpha_I \frac{d_I}{d_M} \right)$$

In the above expression, EI represents a Young's modulus of a material structuring an interlayer insulation film, dM represents a film thickness of the wiring, dI represents a film thickness of the interlayer insulation film, and k1 and k2 represent coefficients determined by wiring materials respectively.

When the gradient of the stress s expressed in the Expression (3) is smaller, it is considered that there is a larger effect of reduction in the stress due to the deformation of the insulation film.

When an insulation film has a structure of a lamination, an effective Young's modulus and an effective coefficient of linear thermal expansion of the insulation film can be obtained from the following three expressions, based on a rule of composition.

$$dI = ds + dh$$

$$EI = (dsEs + dhEh)/dI$$

$$\alpha I = (ds\alpha s + dh\alpha h)/dI$$

When the insulation film has a lamination structure, the s-value can be obtained by introducing the above three expressions into the Expression (3). According to the result of our experiment, the value s represented in the above Expression (3) needed to be $5 \times 10^{-4}$ or smaller in the laminated structure where the current density coefficient n represented 2 or more and the EM resistance was preferable. Accordingly, in order to improve the reliability of EM resistance, it is necessary that the s-value obtained from the above Expression (3) is not larger than $5 \times 10^{-4}$.

In this case, when only first insulation film is formed in contact with the wiring, the n-value also takes a larger value than 2. However, in this case, there is a problem of an occurrence of a crack in the first insulation film, due to the stress from the wiring.

Accordingly, in order to obtain a selection of materials and film thickness that satisfy the condition of $s < 5 \times 10^{-4}$ and also to obtain a structure that solves the problems in crack resistance, water absorbing power and water permeability, the following conditions need to be satisfied. First, it is necessary to form an insulation film made of a material having a low Young's modulus on the wiring in contact with the wiring. It is also necessary to form an insulation film made of a material having a high Young's modulus in contact with this insulation film having the low Young's modulus, thereby to prevent an occurrence of a crack.

From the above, it is concluded that a semiconductor device can obtain sufficient reliability of EM resistance and can solve the problems in crack resistance, water absorbing power and water permeability, when the following conditions are satisfied. That is, the semiconductor device has a wiring and first and second insulation films formed in a laminated structure. In this case, the first and second insulation films have different Young's moduli, and each layer is made of a material and has a film thickness to satisfy the condition of $s < 5 \times 10^{-4}$.

Therefore, according to the present invention, it is possible to obtain a semiconductor device that solves the problems in crack resistance, water absorbing power and water permeability, with improved reliability of EM resistance from the conventional semiconductor device when the following conditions are satisfied. That is, a first insulation film is formed on at least one surface of a wiring. Then, a second insulation film having a higher Young's modulus than that of the first insulation film is formed on the first insulation film in contact with the first insulation film. Further, each layer has a material and a film thickness that satisfy the condition of the gradient of the stress s expressed in the Expression (3) is not larger than $5 \times 10^{-4}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained below with reference to the drawings.

First Embodiment

Figure 1:
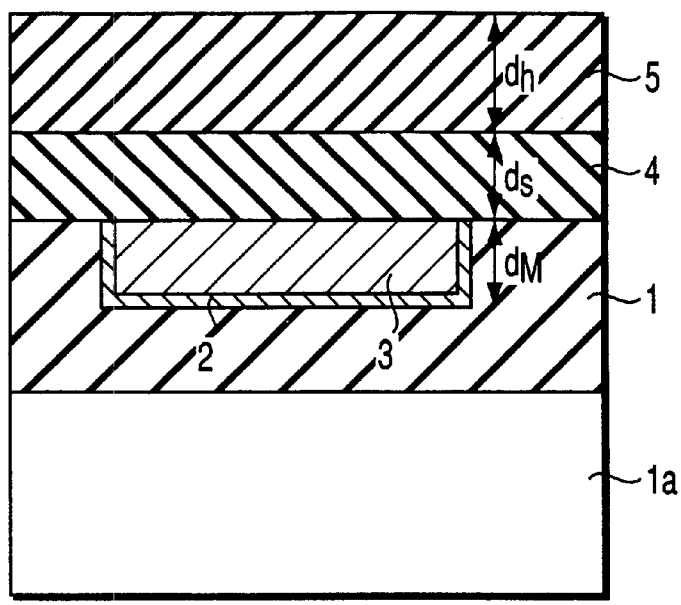
FIG. 1 is a cross sectional view of a semiconductor device according to a first embodiment of the present invention.

FIG. 1 is a cross sectional view of a semiconductor device according to a first embodiment of the present invention. In the present embodiment, an description will be made of a case where an insulation film having a Young's modulus of 15 GPa or lower is formed on the upper surface of a wiring in contact with the wiring.

As shown in FIG. 1, a trench of a thickness of 400 nm is formed on a TEOS-SiO$_2$ film 1 on a substrate 1a. Within this trench, a wiring 3 is formed via a liner material 2. A transistor or the like (not shown), for example, is formed on the substrate 1a. The wiring 3 is brought into contact with, for example, a diffusion layer or the like (not shown) that structures this transistor, via the liner material 2. In this case, the wiring 3 is applied for lower layer, but it can also be applied for upper layer, and the substrate 1a can be used as compound semiconductor substrate or LCD substrate. This also applies to the following description of the present embodiment.

A first insulation film 4 is formed on the wiring 3 and the TEOS-SiO$_2$ film 1. A second insulation film 5 is laminated on the first insulation film 4. The first insulation film 4 is made of a material having a Young's modulus of 15 GPa or lower. The second insulation film 5 is made of a material having Young's modulus higher than 15 GPa.

In the present embodiment, the first insulation film 4 is a silicon oxide film including an organic content, and the second insulation film 5 is an F-added SiO$_2$ film, a TEOS-SiO$_2$ film, or a plasma SiN film. The liner material 2 is Nb, and the wiring 3 is Al.

When the wiring 3, the first insulation film 4 and the second insulation film 5 have film thickness dM, ds and dh respectively, Young's moduli $E_M$, Es and Eh respectively, and coefficients of linear thermal expansion αM, αs and αh respectively, these parameters are formed. to satisfy the following Expression (4). A reference symbol s represents a gradient of the stress working on the wiring depending on temperature 3.

$$s = k_1 \frac{E_M E_I}{E_M + E_I} \cdot \left( \alpha_M - k_2 \alpha_I \frac{d_I}{d_M} \right)$$

In the above Expression (4), it is defined that dI=ds+dh, EI=(dsEs+dhEh)/dI, and αI=(dsαs+dhαh)/dI. Reference symbols k1 and k2 represent coefficients determined by wiring materials. The above k1 and k2 are the coefficients introduced to determine a condition on the same basis from the above Expression (4) even when different wiring materials are used. These coefficients can be obtained by conducting experiments for various wiring materials.

A method of manufacturing the above semiconductor device will be explained.

At first, the TEOS-SiO$_2$ film 1 is formed as an interlayer insulation film. Then, the trench having the thickness of 400 nm is formed on this TEOS-SiO$_2$ film 1. Next, the liner material 2 is formed to cover the surface of the trench. Subsequently, a film is formed using a wiring material by reflow sputtering. Then, the wiring material formed at the outside of the trench is flattened to remove this material by CMP, thereby forming the wiring 3. Then, the first insulation film 4 having a Young's modulus of 51 GPa or lower is formed in the thickness of 400 nm on the wiring 3 and the TEOS-SiO$_2$ film 1. The silicon oxide film including an organic content as the first insulation film 4 is an SOS (Spin on Glass) film formed by spin coating. The organic component included in this SOG film exists in the form of a methyl group. Preferably, the content of the methyl group is 20 wt % or less. As the methyl group has a small molecular structure, it is possible to polymerize this at a lower temperature than when other organic component is polymerized. Next, the second insulation film 5 having a Young's modulus higher than 15 GPa is formed on the first insulation film 4.

The Young's moduli of the materials used in the present semiconductor device are 6 GPa for the silicon oxide film including the organic content, 36 GPa for the F-added SiO$_2$ film, 57 GPa for the TEOS-SiO$_2$ film, and 98 GPa for the plasma SiN film respectively. These Young's moduli are the values obtained by using a force hardness meter.

It is desirable that the film thickness of the second insulation film 5 is set as follows. When the F-added SiO$_2$ film is used as the second insulation film 5, the film thickness is set to 1,000 nm or smaller. When the TEOS-SiO$_2$ film is used, the film thickness is set to 300 nm or smaller. When the plasma SiN film is used, the film thickness is set to 100 nm or smaller.

The reasons why the wiring 3, the first insulation film 4 and the second insulation film 5 are formed in the laminated structure and why the film thickness of the second insulation film 5 is limited as described above will be explained next.

The current density coefficient n that is known as one of parameters of the reliability of EM resistance is a yardstick for expressing the reliability of EM resistance, like MTF (Mean Time to Failure) and activation energy. When the n-value is larger, the reliability of EM resistance is higher. In the conventional semiconductor device, when only one layer insulation film is formed in contact with the wiring, and when the insulation film is not deformed by the stress received from the wiring, the n-value is ideally determined as two. This value is obtained from a time taken (incubation time) before the resistance starts to increase due to the EM. This n-value will never take a larger value than two. Accordingly, when the n-value is two or above, the reliability of EM resistance improves from the case where the insulation film has one layer which is not deformed by the stress.

On the other hand, when the gradient s of the stress working on the wiring is smaller, it is considered that there is a larger effect of reduction in the stress due to the deformation of the insulation film. This stress reduction effect is similarly obtained when a stress is generated in the wiring due to EM, as well as when a thermal stress is generated. According to the result of our experiment, the value s represented in the above Expression (4) needed to be $5\times10^{-4}$ or smaller in the laminated structure where the current density coefficient n represented 2 or more and the EM resistance was preferable. Accordingly, in order to improve the reliability of EM resistance, it is necessary that the s-value obtained from the above Expression (4) is not larger than $5\times10^{-4}$.

In this case, when only one layer of an insulation film is formed in contact with the wiring, and when the insulation film is deformed by the stress received from the wiring, n-value also takes a larger value than 2. However, in this case, there is a problem of an occurrence of a crack.

Accordingly, in order to obtain a selection of materials and film thickness that satisfy the condition of $s<5\times10^{-4}$ and also to obtain a structure that solves the problems in crack resistance, water absorbing power and water permeability, the following conditions need to be satisfied. First, it is necessary to form an insulation film made of a material having a low Young's modulus on the wiring in contact with the wiring. Further, it is also necessary to form an insulation film made of a material having a high Young's modulus in contact with this insulation film having the low Young's modulus.

From the above, it is concluded that a semiconductor device can obtain sufficient reliability of EM resistance and can solve the problems in crack resistance, water absorbing power and water permeability, when the following conditions are satisfied. That is, the semiconductor device has a wiring and first and second insulation films formed in a laminated structure. In this case, the first and second insulation films have different Young's moduli, and each layer is made of a material and has a film thickness to satisfy the condition of $s<5\times10^{-4}$.

In the present embodiment, the wiring 3 and the material and the film thickness of the first insulation film 4 are substituted into the above Expression (4). Then, the material of the second insulation film 5 is changed to various alternatives. In this case, the film thickness of the second insulation film 5 becomes 1,000 nm or smaller in the case of the F-added $SiO_2$ film, 300 nm or smaller in the case of the TEOS-$SiO_2$ film, and 100 nm or smaller in the case of the plasma SiN film respectively.

Next, Table 1 shows film thickness of the insulation films 4 and 5, s-values, MTFs, current density coefficients n, and crack resistances obtained as a result of carrying out an experiment by variously changing the film thickness and the material of the second insulation film.

TABLE 1

| First insulation film | Second insulation film | ds (nm) | dh (nm) | s | MTF | n | Crack resistance |
|---|---|---|---|---|---|---|---|
| Organic SOG | F-ADDED $SiO_2$ | 400 | 0 | $1.3 \times 10^{-4}$ | ⊙ | >2 | X |
| Organic SOG | F-ADDED $SiO_2$ | 400 | 10 | $1.5 \times 10^{-4}$ | ⊙ | >2 | ○ |
| Organic SOG | F-ADDED $SiO_2$ | 400 | 100 | $2.5 \times 10^{-4}$ | ⊙ | >2 | ○ |
| Organic SOG | F-ADDED $SiO_2$ | 400 | 200 | $3.2 \times 10^{-4}$ | ○ | >2 | ○ |
| Organic SOG | F-ADDED $SiO_2$ | 400 | 300 | $3.7 \times 10^{-4}$ | ○ | >2 | ○ |
| Organic SOG | F-ADDED $SiO_2$ | 400 | 400 | $4.0 \times 10^{-4}$ | ○ | >2 | ○ |
| Organic SOG | F-ADDED $SiO_2$ | 400 | 1000 | $4.9 \times 10^{-4}$ | ○ | >2 | ○ |
| Organic SOG | F-ADDED $SiO_2$ | 400 | 1300 | $5.1 \times 10^{-4}$ | Δ | 2 | ○ |
| Organic SOG | TEOS | 400 | 10 | $1.6 \times 10^{-4}$ | ⊙ | >2 | ○ |
| Organic SOG | TEOS | 400 | 100 | $3.2 \times 10^{-4}$ | ⊙ | >2 | ○ |
| Organic SOG | TEOS | 400 | 200 | $4.3 \times 10^{-4}$ | ○ | >2 | ○ |
| Organic SOG | TEOS | 400 | 300 | $4.9 \times 10^{-4}$ | ○ | >2 | ○ |
| Organic SOG | TEOS | 400 | 400 | $5.4 \times 10^{-4}$ | Δ | 2 | ○ |
| Organic SOG | SiN | 400 | 10 | $1.8 \times 10^{-4}$ | ⊙ | >2 | ○ |
| Organic SOG | SiN | 400 | 50 | $3.2 \times 10^{-4}$ | ⊙ | >2 | ○ |
| Organic SOG | SiN | 400 | 100 | $4.5 \times 10^{-4}$ | ○ | >2 | ○ |
| Organic SOG | SiN | 400 | 200 | $6.0 \times 10^{-4}$ | Δ | 2 | ○ |
| Organic SOG | SiN | 400 | 400 | $7.6 \times 10^{-4}$ | Δ | 2 | ○ |
| TEOS | SiN | 600 | 600 | $9.6 \times 10^{-4}$ | Conventional product | 2 | ○ |

(Reliability of EM resistance: ⊙ extremely improved from the conventional product;
○ improved from the conventional product;
Δ about the same level as the conventional product)

Table 1 shows results of the experiment obtained from the first insulation film 4 and the second insulation film 5 of the present invention. For comparison with the present invention, Table 1 also shows a result of testing a laminated film including a TEOS-$SiO_2$ film having a film thickness of 600 nm and a plasma SiN film having a film thickness of 600 nm, as an example of a conventional film structure that is not deformed by the stress received from the wiring.

The wiring material used is Al. This wiring material has the Young's modulus $E_M$ as 80 GPa, the film thickness dM as 400 nm, and the coefficient of linear thermal expansion aM $\alpha s$ $2.4\times10^{-5}$, respectively. As a result of a measurement, k1 was equal to 1 and k2 was equal to $1.0\times10^{-3}$ when the wiring is Al. The coefficients of linear thermal expansion of the insulation films were obtained by measuring a change in the temperature of a warp by using a wafer warp-measuring unit. The coefficient of linear thermal expansion of the silicon oxide film including an organic content ($\alpha s$) was $10^{-5}$, and the coefficient of linear thermal expansion ($\alpha h$) was $7\times10^{-6}$ for the F-added $SiO_2$ film, the TEOS-$SiO_2$ film and the plasma SiN film respectively. Specifically, the film thickness dM of the wiring 400 nm is a sum of the film thickness of the liner material 2 and the film thickness of the Al wiring 3.

An average life of EM (MTF) of the conventional structure shown in the comparative example was 75 hours under a condition of acceleration. A result of comparison between this MTF and the MTF of each of the alternative cases is shown in the column of MTF in Table 1. The MTF obtained as less than 90 hours under the same acceleration condition as that used in the present.invention is expressed as about the same level as the MTF of the conventional product. When the MTF obtained is equal to or more than 90 hours and less than 120 hours, this is expressed as an improvement from the MTF of the conventional product. When the MTF obtained is 120 hours or more, this is expressed as an extreme improvement from the MTF of the conventional product.

In the conventional insulation films that have a large Young's modulus, the current density coefficient n was equal to two under the condition that there occurs no deformation in the insulation films that are in contact with the wiring due to the EM. On the other hand, the n-value takes a larger 1,000 nm or smaller. When a TEOS-SiO$_2$ film is used, the film thickness is 300 nm or smaller. When a plasma SiN film is used, the film thickness is 100 nm or smaller.

Next, there will be explained below the reasons why the first insulation film 4 has the Young's modulus of 15 GPa or lower and the second insulation film 5 has the Young's modulus higher than 15 GPa.

Table 2 shows s-values, MTFs, current density coefficients n, and crack resistances obtained as a result of carrying out an experiment of variously changing the Young's modulus of the first insulation film 4 in a structure similar to that of FIG. 1.

TABLE 2

| First insulation film | Second insulation film | ds (nm) | dh (nm) | s | MTF | n | Crack resistance |
|---|---|---|---|---|---|---|---|
| Organic SOG (5 Gpa) | SiN | 400 | 0 | $9.8 \times 10^{-5}$ | ⊚ | >2 | X |
| Organic SOG (5 Gpa) | SiN | 400 | 10 | $1.4 \times 10^{-4}$ | ⊚ | >2 | ○ |
| Organic SOG (5 Gpa) | SiN | 400 | 50 | $2.8 \times 10^{-4}$ | ⊚ | >2 | ○ |
| Organic SOG (8 Gpa) | SiN | 400 | 0 | $1.5 \times 10^{-4}$ | ⊚ | >2 | X |
| Organic SOG (8 Gpa) | SiN | 400 | 10 | $1.9 \times 10^{-4}$ | ⊚ | >2 | ○ |
| Organic SOG (8 Gpa) | SiN | 400 | 50 | $3.2 \times 10^{-4}$ | ⊚ | >2 | ○ |
| Organic SOG (10 Gpa) | SiN | 400 | 0 | $1.9 \times 10^{-4}$ | ⊚ | >2 | X |
| Organic SOG (10 Gpa) | SiN | 400 | 10 | $2.3 \times 10^{-4}$ | ⊚ | >2 | ○ |
| Organic SOG (10 Gpa) | SiN | 400 | 50 | $3.5 \times 10^{-4}$ | ⊚ | >2 | ○ |
| F-ADDED SiO$_2$ (15 Gpa) | SiN | 400 | 0 | $2.7 \times 10^{-4}$ | ⊚ | >2 | X |
| F-ADDED SiO$_2$ (15 Gpa) | SiN | 400 | 10 | $3.1 \times 10^{-4}$ | ⊚ | >2 | ○ |
| F-ADDED SiO$_2$ (15 Gpa) | SiN | 400 | 100 | $4.1 \times 10^{-4}$ | ○ | >2 | ○ |
| F-ADDED SiO$_2$ (28 Gpa) | SiN | 400 | 0 | $4.7 \times 10^{-4}$ | ○ | >2 | X |
| F-ADDED SiO$_2$ (28 Gpa) | SiN | 400 | 10 | $5.0 \times 10^{-4}$ | Δ | 2 | ○ |
| F-ADDED SiO$_2$ (28 Gpa) | SiN | 400 | 50 | $5.7 \times 10^{-4}$ | Δ | 2 | ○ |
| F-ADDED SiO$_2$ (36 Gpa) | SiN | 400 | 0 | $5.7 \times 10^{-4}$ | Δ | 2 | ○ |
| F-ADDED SiO$_2$ (36 Gpa) | SiN | 400 | 10 | $5.9 \times 10^{-4}$ | Δ | 2 | ○ |
| F-ADDED SiO$_2$ (36 Gpa) | SiN | 400 | 50 | $6.5 \times 10^{-4}$ | Δ | 2 | ○ |
| TEOS (57 Gpa) | SiN | 400 | 0 | $8.0 \times 10^{-4}$ | Conventional product | 2 | ○ |
| TEOS (57 Gpa) | SiN | 400 | 10 | $8.1 \times 10^{-4}$ | Conventional product | 2 | ○ |
| TEOS (57 Gpa) | SiN | 400 | 50 | $8.4 \times 10^{-4}$ | Conventional product | 2 | ○ |

(Reliability of EM resistance: ⊚ extremely improved from the conventional product;
○ improved from the conventional product;
Δ about the same level as the conventional product)

value than two under the condition that the insulation films are deformed by the stress received from the wiring like the wiring structure of the present embodiment. When only the first insulation film 4 was formed on the wiring, the MTF improved extremely from that of the conventional product, and the n-value was larger than two, as shown in Table 1. However, a crack occurred in this case. When the second insulation film 5 was formed in a film thickness of 10 nm on the first insulation film 4, it was possible to prevent the occurrence of a crack. When the film thickness of the second insulation film 5 was gradually changed, there occurred no crack in the structure having the s-value $5 \times 10^{-4}$ or larger. However, both the MTF and the n-value were about the same as those of the conventional product. In the wiring structure having the s-value smaller than $5 \times 10^{-4}$, the MTF improved by 20% or more from that of the conventional product, and the n-value was larger than two. Further, when the s-value equals to or smaller than $3.5 \times 10^{-4}$, the n-value was also larger than two, and the MTF improved by 60% or more from that of the conventional product.

As observed in the above, it is possible to solve the problems in crack resistance, water absorbing power and water permeability and to improve the MTF when the second insulation film 5 has the following film thickness. When an F-added SiO$_2$ film is used, the film thickness is In the experiment shown in Table 2, the Al wiring 3 is formed at first. Then, the first insulation film 4 is formed on the upper surface of the wiring by using each one of the organic SOG film, the F-added SiO$_2$ film, and the TEOS-SiO$_2$ films at one time. In the case of the organic SOG film, the film formed was heat-treated during three different heat treatment times of 30 minutes, 45 minutes and 60 minutes, at 450° C. respectively. Further, in the case of forming the F-added SiO$_2$ film, the density of F to be added was changed to three levels of 4 RI%, 6 RI%, and 8 RI%, thereby changing the Young's modulus. The Young's moduli of the respective insulation films of the F-added SiO$_2$ films obtained are 36 GPa, 28 GPa and 15 GPa in the order of low to high F density. The Young's moduli obtained for the silicon oxide films including an organic content are 10 GPa, 8 GPa and 5 GPa in the order of long to short heat treatment time. Based on the above arrangement, the first insulation films 4 having the Young's moduli from 5 GPa to 57 GPa were obtained.

Further, on the first insulation film 4, the plasma SiN film was formed in the thickness of 10 nm or 50 nm as the second insulation film 5 respectively. For comparison with the present invention, Table 2 also shows a case of using Al for the wiring 3, a TEOS-SiO$_2$ film in place of the first insulation film 4, and a plasma SiN film of 10 nm or 50 nm in place the second insulation film 5 respectively.

When the Young's modulus of the first insulation film 4 formed on the wiring was 36 GPa or higher, there was no occurrence of a crack in the case of a single layer, that is, when the second insulation film 5 was not formed. However, there was no improvement in the EM resistance from that of the conventional product. When the Young's modulus was 28 GPa, there was observed an improvement in the EM resistance in the case of the single layer. However, a crack occurred in the case of the single layer. When the Young's modulus was 15 GPa or lower, a crack occurred in the case of the single layer. However, in all cases, it was possible to prevent the occurrence of a crack when the plasma SiN film was laminated to the thickness of 10 nm. When the insulation film has the Young's modulus of 15 GPa or lower, the EM resistance higher than that of the conventional product was observed in both cases of when the film thickness of the plasma SiN film was 10 nm and 50 nm.

From the above, it can be understood that the first insulation film 4 needs to have the Young's modulus of 15 GPa or lower. Further, when the crack resistance, water absorbing power and water permeability are taken into consideration, the second insulation film 5 having a higher Young's modulus than that of the first insulation film 4 is necessary. Therefore, the second insulation film 5 needs to have the Young's modulus higher than 15 GPa.

When other films were used for the first insulation film 4 having the Young's modulus of 15 GPa or lower, it was also possible to obtain similar effects to those described above. These films include a film including silicon oxide as a main component with an organic content, an organic film represented by polyimide, and a silicon oxide film including an inorganic additive.

Second Embodiment

Figure 2:
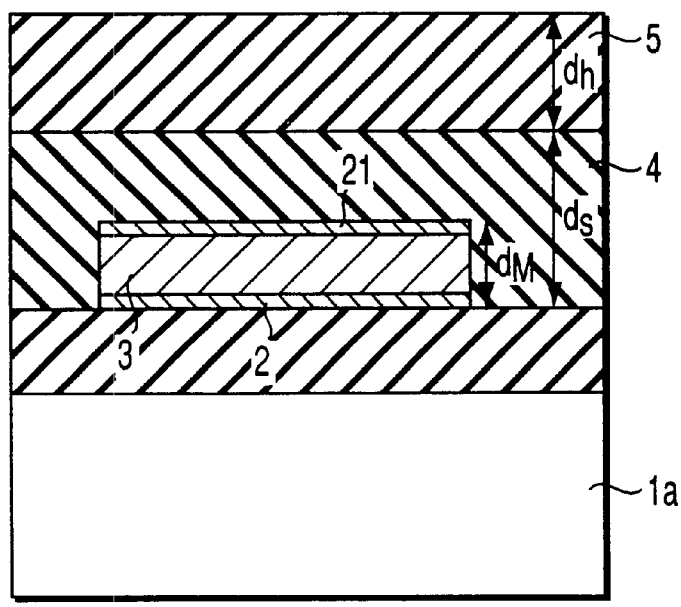
FIG. 2 is a cross sectional view of a semiconductor device according to a second embodiment of the present invention.

FIG. 2 is a cross sectional view of a semiconductor device according to a second embodiment of the present invention. In the present embodiment, an description will be made of a case where an insulation film having a Young's modulus of 15 GPa or lower is formed on an upper surface and side surfaces of a wiring in contact with the wiring. In the following embodiment, structural parts common to those of the first embodiment are attached with identical reference symbols, and their detailed description will be omitted.

As shown in FIG. 2, a wiring 3 is formed on a TEOS-SiO$_2$ film 1 on a substrate 1a. A first insulation film 4 is formed on the whole surface of the TEOS-SiO$_2$ film 1 so that the first insulation film 4 is in contact with the upper surface and the side surfaces of the wiring 3. A second insulation film 5 is formed on the first insulation film 4. A liner material 2 is formed between the wiring 3 and the TEOS-SiO$_2$ film 1. Also, a reflection preventive film 21 is formed between the wiring 3 and the first insulation film 4. The first insulation film 4 is made of a material having a Young's modulus of 15 GPa or lower, and the second insulation film 5 is made of a material having a Young's modulus higher than 15 GPa. This also applies to the following description of the present embodiment.

In the present embodiment, the first insulation film 4 is a silicon oxide film including an organic content, the second insulation film 5 is an F-added SiO$_2$ film, or a TEOS-SiO$_2$ film or a plasma SiN film, the liner material 2 is Ti/TiN, and the wiring 3 is Al.

Parameters of the wiring 3, the first insulation film 4 and the second insulation film 5 are formed respectively to satisfy the Expression (4) shown in the first embodiment. The first insulation film 4 has a film thickness ds from an interface between the first insulation film 4 and the TEOS-SiO$_2$ film 1 to an interface between the first insulation film 4 and the second insulation film 5.

A method of manufacturing the semiconductor device will be explained next.

At first, a film of the liner material 2 made of a lamination of a Ti layer of 20 nm and a Ti layer of 10 nm is formed on the TEOS-SiO$_2$ film 1. Next, a film of the wiring material is formed in a thickness of 400 nm, and the reflection preventive film 21 is formed to have a laminated structure of a Ti layer in the thickness of 5 nm and a TiN layer in the thickness of 60 nm. Thereafter, a patterning is conducted by RIE, thereby forming the wiring 3.

Next, the first insulation film 4 is formed as a passivation film. In this case, the first insulation film 4 has a film thickness (ds in FIG. 2) of 600 nm. The second insulation film 5 is formed on the first insulation film 4.

It is desirable that the film thickness of the second insulation film 5 that satisfy the condition of the gradient s expressed in the Expression (3) is not larger than $5 \times 10^{-4}$ is set as follows. When the F-added SiO$_2$ film is used as the second insulation film 5, the film thickness is set to 1,500 nm or smaller. When the TEOS-SiO$_2$ film is used, the film thickness is set to 400 nm or smaller. When the plasma SiN film is used, the film thickness is set to 100 nm or smaller.

For the same reasons as explained in the first embodiment, the wiring 3, the first insulation film 4 and the second insulation film 5 are formed in the laminated structure in the present embodiment. Similarly, the first insulation film 4 also has the Young's modulus of 15 GPa or lower, and the second insulation film 5 has the Young's modulus higher than 15 GPa. The description of the above reasons will be omitted here.

Next, for the semiconductor device manufactured in the above-described process, an experiment was carried out by variously changing the film thickness and the material of the second insulation film under conditions similar to those of the first embodiment. Table 3 shows film thickness of the insulation films 4 and 5, s-values, MTFs, current density coefficients n, and crack resistances of the semiconductor device obtained as a result of the experiment. Further, for comparison with the present invention, a conventional structure was also experimented in a similar manner. In the convention structure, TEOS-SiO$_2$ (600 nm) and plasma SiN (600 nm) were laminated on the Al wiring.

TABLE 3

| First insulation film | Second insulation film | ds (nm) | dh (nm) | s | MTF | n | Crack resistance |
|---|---|---|---|---|---|---|---|
| Organic SOG | F-ADDED SiO$_2$ | 600 | 0 | $1.3 \times 10^{-4}$ | ⊚ | >2 | X |
| Organic SOG | F-ADDED SiO$_2$ | 600 | 10 | $1.4 \times 10^{-4}$ | ⊚ | >2 | ○ |
| Organic SOG | F-ADDED SiO$_2$ | 600 | 100 | $2.2 \times 10^{-4}$ | ⊚ | >2 | ○ |
| Organic SOG | F-ADDED SiO$_2$ | 600 | 400 | $3.5 \times 10^{-4}$ | ○ | >2 | ○ |
| Organic SOG | F-ADDED SiO$_2$ | 600 | 500 | $3.8 \times 10^{-4}$ | ○ | >2 | ○ |

TABLE 3-continued

| First insulation film | Second insulation film | ds (nm) | dh (nm) | s | MTF | n | Crack resistance |
|---|---|---|---|---|---|---|---|
| Organic SOG | F-ADDED SiO$_2$ | 600 | 1000 | $4.5 \times 10^{-4}$ | ○ | >2 | ○ |
| Organic SOG | F-ADDED SiO$_2$ | 600 | 1500 | $4.9 \times 10^{-4}$ | ○ | >2 | ○ |
| Organic SOG | F-ADDED SiO$_2$ | 600 | 2000 | $5.1 \times 10^{-4}$ | Δ | 2 | ○ |
| Organic SOG | TEOS | 600 | 10 | $1.5 \times 10^{-4}$ | ⊙ | >2 | ○ |
| Organic SOG | TEOS | 600 | 100 | $2.7 \times 10^{-4}$ | ⊙ | >2 | ○ |
| Organic SOG | TEOS | 600 | 200 | $3.6 \times 10^{-4}$ | ○ | >2 | ○ |
| Organic SOG | TEOS | 600 | 400 | $4.8 \times 10^{-4}$ | ○ | >2 | ○ |
| Organic SOG | TEOS | 600 | 500 | $5.1 \times 10^{-4}$ | Δ | 2 | ○ |
| Organic SOG | SiN | 600 | 10 | $1.6 \times 10^{-4}$ | ⊙ | >2 | ○ |
| Organic SOG | SiN | 600 | 50 | $2.7 \times 10^{-4}$ | ⊙ | >2 | ○ |
| Organic SOG | SiN | 600 | 100 | $3.7 \times 10^{-4}$ | ○ | >2 | ○ |
| Organic SOG | SiN | 600 | 200 | $5.1 \times 10^{-4}$ | Δ | 2 | ○ |
| Organic SOG | SiN | 600 | 400 | $6.7 \times 10^{-4}$ | Δ | 2 | ○ |
| TEOS | SiN | 600 | 600 | $9.6 \times 10^{-4}$ | Conventional product | 2 | ○ |

(Reliability of EM resistance: ⊙ extremely improved from the conventional product;
○ improved from the conventional product;
Δ about the same level as the conventional product)

The film thickness dM of the wiring was set to 495 nm which is a sum of the film thickness of the liner material 2, the wiring 3 and the reflection preventive film 21 respectively. MTF of the conventional product was evaluated in a similar manner to that of the first embodiment, by using a TEOS-SiO$_2$/SiN laminated structure in place of the first and second insulation films.

As shown in Table 3, when only the first insulation film 4 was formed on the wiring 3 and also when the second insulation film 5 was not formed, the MTF improved extremely from that of the conventional product, and the n-value was also larger than two. However, a crack occurred in this case. It was possible to prevent the occurrence of a crack when the second insulation film 5 was formed in the thickness of 10 nm on the first insulation film 4.

When the film thickness of the second insulation film 5 was gradually changed, there was no occurrence of a crack in the structure where the s-value is $5 \times 10^{-4}$ or larger. However, both the MTF and the n-value were about the same as those of the conventional product. In the wiring structure having the s-value smaller than $5 \times 10^{-4}$, the MTF improved by 20% or more from that of the conventional product, and the n-value was larger than two. Further, when the s-value equals to or smaller than $3.5 \times 10^{-4}$, the n-value was also larger than two, and the MTF improved by 60% or more from that of the conventional product.

As observed in the above, according to the present embodiment, it is also possible to solve the problems in crack resistance, water absorbing power and water permeability and to improve the MTF in a similar manner to that of the first embodiment when the insulation film having the Young's modulus of 15 GPa or lower is formed on both an upper surface and side surfaces of the wiring in contact with the wiring. As the first insulation film 4 is formed on the side surfaces of the wiring 3 as well, the reliability of EM resistance can be improved from the first embodiment.

Third Embodiment

Figure 3A:
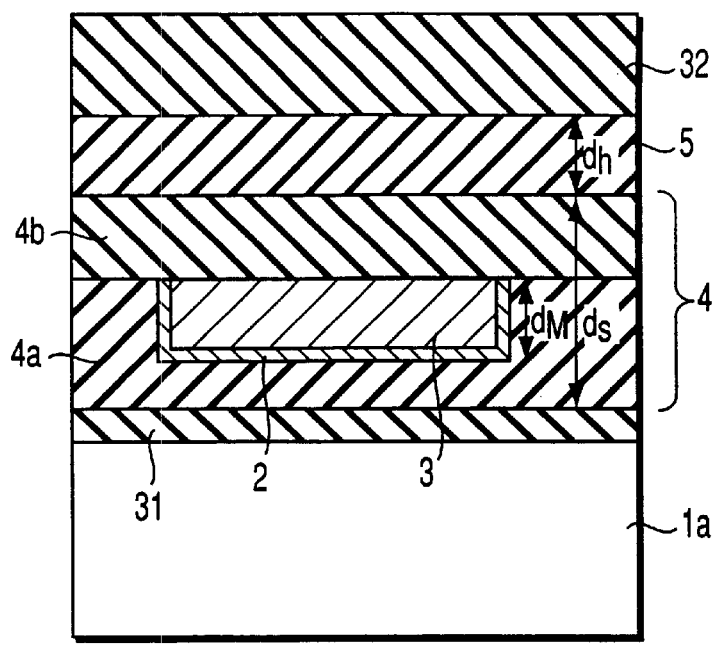
FIG. 3A is a cross sectional view of a semiconductor device according to a third embodiment of the present invention.

FIG. 3A is a cross sectional view of a semiconductor device according to a third embodiment of the present invention. In the present embodiment, an description will be made of a case where the whole surfaces of a wiring are surrounded by an insulation film having a Young's modulus of 15 GPa or lower.

As shown in FIG. 3A, a first insulation film 4 is formed on a thermally-oxidized SiO$_2$ film 31 on a substrate 1a. The first insulation film 4 has a laminated structure of interlayer insulation films 4a and 4b. The interlayer insulation film 4a is formed with a trench. A liner material 2 is formed to cover a bottom surface and side surfaces of this trench. A wiring 3 is embedded into this trench via the liner material 2. A second insulation film 5 is formed on the first insulation film 4. Further, a plasma SiN film 32 is formed on the second insulation film 5. The first insulation film 4 is made of a material having a Young's modulus of 15 GPa or lower, and the second insulation film 5 is made of a material having a Young's modulus higher than 15 GPa.

In the present embodiment, the first insulation film 4 is a silicon oxide film including an organic content, the second insulation film 5 is an F-added SiO$_2$ film or a TEOS-SiO$_2$ film, the liner material 2 is Nb, and the wiring 3 is Al.

Parameters of the wiring 3, the first insulation film 4 and the second insulation film 5 are formed respectively to satisfy the condition of the gradient s expressed in the Expression (3) shown in the first embodiment is not larger than $5 \times 10^{-4}$. The first insulation film 4 has a film thickness ds from an interface between the first insulation film 4 and the thermally-oxidized TEOS-SiO$_2$ film 31 to an interface between the first insulation film 4 and the second insulation film 5.

A method of manufacturing this semiconductor device will be explained next.

At first, the thermally-oxidized SiO$_2$ film 31 is formed on a substrate not shown. Then, the interlayer insulation film 4a is formed in the thickness of 800 nm. Then, the trench is formed on the interlayer insulation film 4a for mounting the wiring thereon. The trench has a thickness of 400 nm. Next, the liner material 2 made of Nb is formed to have a film thickness of 15 nm. Subsequently, a film is formed using a wiring material within the trench by reflow sputtering. Then, the wiring material formed at the outside of the trench is flattened to remove this material by CMP, thereby forming the wiring 3. On an upper surface of the wiring, the interlayer insulation film 4b is formed in the thickness of 400 nm. The second insulation film 5 is formed on the first insulation film 4 made of the interlayer insulation films 4a and 4b. Further, on an upper surface of the second insulation film 5, the plasma SiN film 32 is formed in the thickness of 600 nm.

It is desirable that the film of the second insulation film 5 is set as follows. When the F-added $SiO_2$ film is used, the film thickness is set to 3,000 nm or smaller. When the TEOS-$SiO_2$ film is used, the film thickness is set to 800 nm or smaller.

Next, for the semiconductor device manufactured in the above-described process, an experiment was carried out by variously changing the film thickness and the material of the second insulation film under conditions similar to those of the second embodiment. Table 4 shows film thickness of the insulation films 4 and 5, s-values, MTFs, current density coefficients n, and crack resistances obtained as a result of the experiment.

formed in a film thickness of 10 nm on the first insulation film 4, it was possible to prevent the occurrence of a crack.

When the film thickness of the second insulation film 5 was gradually changed, there occurred no crack in the structure having the s-value of $5 \times 10^{-4}$ or larger. However, both the MTF and the n-value were about the same as those of the conventional product. In the wiring structure having the s-value smaller than $5 \times 10^{-4}$ the MTF improved by 20% or more from that of the conventional product, and the n-value was larger than two. Further, when the s-value equals to or smaller than $5 \times 10^{-4}$, the n-value was also larger than two, and the MTF improved by 60% or more from that of the conventional product.

TABLE 4

| First insulation film | Second insulation film | ds (nm) | dh (nm) | s | MTF | n | Crack resistance |
|---|---|---|---|---|---|---|---|
| Organic SOG | F-ADDED $SiO_2$ | 1200 | 0 | $1.3 \times 10^{-4}$ | ⊚ | >2 | X |
| Organic SOG | F-ADDED $SiO_2$ | 1200 | 10 | $1.4 \times 10^{-4}$ | ⊚ | >2 | ○ |
| Organic SOG | F-ADDED $SiO_2$ | 1200 | 400 | $2.8 \times 10^{-4}$ | ⊚ | >2 | ○ |
| Organic SOG | F-ADDED $SiO_2$ | 1200 | 800 | $3.5 \times 10^{-4}$ | ⊚ | >2 | ○ |
| Organic SOG | F-ADDED $SiO_2$ | 1200 | 1000 | $3.8 \times 10^{-4}$ | ○ | >2 | ○ |
| Organic SOG | F-ADDED $SiO_2$ | 1200 | 2000 | $4.5 \times 10^{-4}$ | ○ | >2 | ○ |
| Organic SOG | F-ADDED $SiO_2$ | 1200 | 3000 | $4.9 \times 10^{-4}$ | ○ | >2 | ○ |
| Organic SOG | F-ADDED $SiO_2$ | 1200 | 4000 | $5.1 \times 10^{-4}$ | Δ | 2 | ○ |
| Organic SOG | TEOS | 1200 | 10 | $1.4 \times 10^{-4}$ | ⊚ | >2 | ○ |
| Organic SOG | TEOS | 1200 | 100 | $2.1 \times 10^{-4}$ | ⊚ | >2 | ○ |
| Organic SOG | TEOS | 1200 | 300 | $3.2 \times 10^{-4}$ | ⊚ | >2 | ○ |
| Organic SOG | TEOS | 1200 | 400 | $3.6 \times 10^{-4}$ | ○ | >2 | ○ |
| Organic SOG | TEOS | 1200 | 800 | $4.8 \times 10^{-4}$ | ○ | >2 | ○ |
| Organic SOG | TEOS | 1200 | 1000 | $5.1 \times 10^{-4}$ | Δ | 2 | |
| TEOS | SiN | 1600 | 600 | $8.8 \times 10^{-4}$ | Conventional product | 2 | ○ |

(Reliability of EM resistance: ⊚ extremely improved from the conventional product;
○ improved from the conventional product;
Δ about the same level as the conventional product)

Figure 3B:
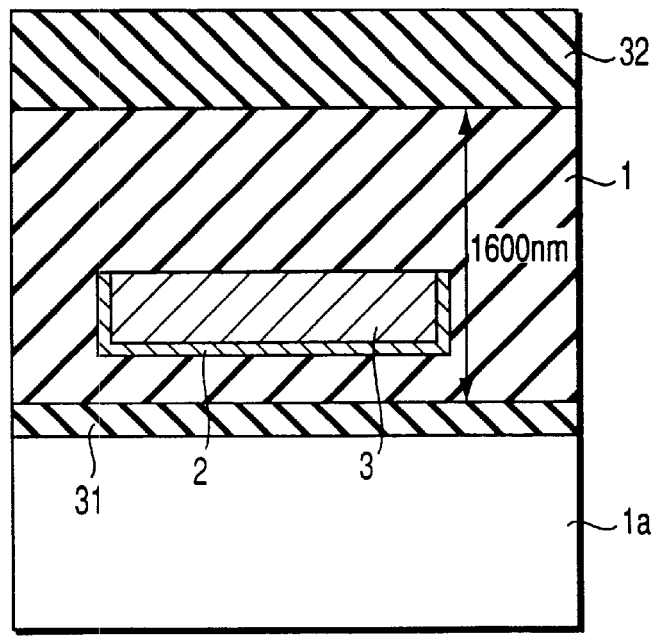
FIG. 3B is a cross sectional view of a semiconductor device for comparison with the semiconductor device of the third embodiment.

For comparison with the present invention, an EM test was also carried out in a similar manner for a conventional structure having an Al wiring using a TEOS-$SiO_2$/SiN laminated film for the interlayer insulation film. FIG. 3B shows a cross sectional view of this comparative example. The structure of FIG. 3B is different from that of the present embodiment only in that the interlayer insulation film is formed by using the TEOS-$SiO_2$ film 1 in place of the first insulation film 4 and the second insulation film 5. The TEOS-$SiO_2$ film 1 has a film thickness of 1,600 nm.

In the present embodiment, the first insulation film 4 has the film thickness ds of 1,200 nm. This film thickness is a total film thickness from an interface between the first insulation film 4 and the thermally-oxidized $SiO_2$ film 31 formed below the wiring 3 to an interface between the first insulation film 4 and the second insulation film 5 formed above the wiring 3. The second insulation film 5 includes only the F-added $SiO_2$ film or the TEOS-$SiO_2$ film that is in contact with the upper surface of the first insulation film 4. The plasma SiN film 32 on the top layer is not in direct contact with the first insulation film 4. This plasma SiN film 32 is not included in the second insulation film 5 because of a smaller effect of the plasma SiN film 32.

MTF was evaluated in a similar manner to that of the preceding embodiment based on the wiring that uses the TEOS-$SiO_2$/SiN laminated film shown in FIG. 3B as the interlayer insulation film. When only the first insulation film 4 was formed on the wiring 3, the MTF improved extremely from that of the conventional product, and the n-value was larger than two, as shown in Table 4. However, a crack occurred in this case. When the second insulation film 5 was As observed in the above, according to the present embodiment, it is also possible to solve the problems in crack resistance, water absorbing power and water permeability and to improve the MTF in a similar manner to that of the first and second embodiments when the insulation film having the Young's modulus of 15 GPa or lower is formed to cover the whole surfaces of the wiring. As the first insulation film 4 is formed on both the side surfaces and the bottom surface of the wiring 3, the reliability of EM resistance can be improved from the first and second embodiments.

Fourth Embodiment

Figure 4A:
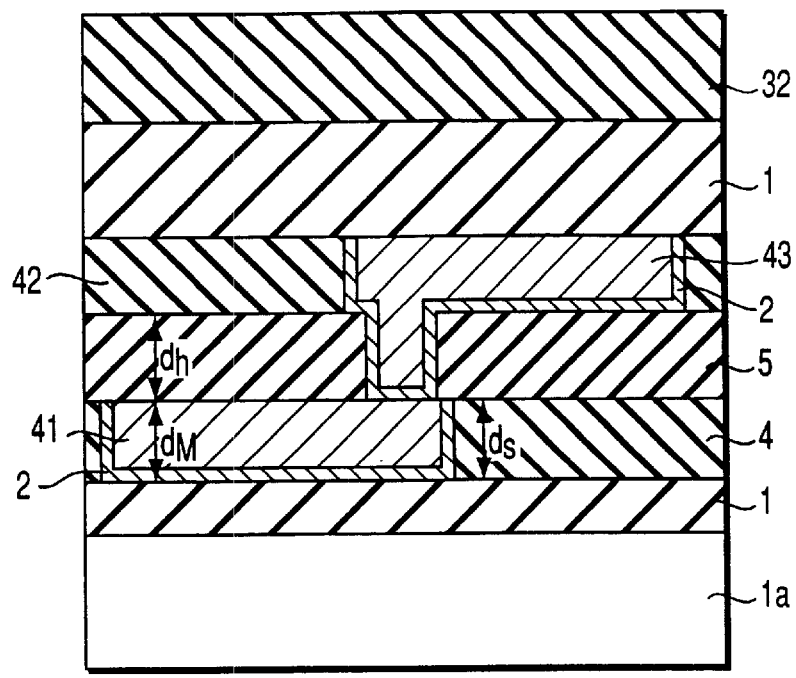
FIG. 4A is a cross sectional view of a semiconductor device according to a fourth embodiment of the present invention.

FIG. 4A is a cross sectional view of a semiconductor device according to a fourth embodiment of the present invention. In the present embodiment, an description will be made of a case where, in a multilayer wiring, an insulation film having a Young's modulus of 15 GPa or lower is used between wirings, and an insulation film having a Young's modulus higher than 15 GPa is used between layers.

As shown in FIG. 4A, a first insulation film 4 is formed on a TEOS-$SiO_2$ film 1 on a substrate 1a. A first wiring 41 is embedded into the first insulation film 4 via a liner material 2. A second insulation film 5 is formed on the first wiring 41 and the first insulation film 4. An interlayer insulation film 42 is formed on the second insulation film 5. A trench is formed on the interlayer insulation film 42. Further, in part of this trench, there is formed a veer hole piercing through the first wiring 41 via the second insulation film 5. A second wiring 43 is embedded into the veer hole and the trench. A liner material 2 is formed on the surfaces of the second wiring 43 excluding an upper surface. A TEOS-SiO$_2$ film 2 is formed on the second wiring 43 and the second insulation film 5. Further, a plasma SiN film 32 is formed on the TEOS-SiO$_2$ film 1.

Parameters of the wiring 3, the first insulation film 4 and the second insulation film 5 are formed respectively to satisfy the condition of the gradient s expressed in the Expression (4) shown in the first embodiment is not larger than $5\times10^{-4}$.

thickness is set to 200 nm or smaller. When the plasma SiN film is used, the film thickness is set to 50 nm or smaller.

Next, for the semiconductor device manufactured in the above-described process, an experiment was carried out by variously changing the film thickness and the material of the second insulation film. Table 5 shows film thickness of the insulation films 4 and 5, s-values, MTFs, current density coefficients n, and crack resistances obtained as a result of the experiment.

TABLE 5

| First insulation film | Second insulation film | ds (nm) | dh (nm) | s | MTF | n | Crack resistance |
|---|---|---|---|---|---|---|---|
| Organic SOG | F-ADDED SiO$_2$ | 300 | 0 | $1.3 \times 10^{-4}$ | ◎ | >2 | X |
| Organic SOG | F-ADDED SiO$_2$ | 300 | 10 | $1.5 \times 10^{-4}$ | ◎ | >2 | ○ |
| Organic SOG | F-ADDED SiO$_2$ | 300 | 100 | $2.8 \times 10^{-4}$ | ◎ | >2 | ○ |
| Organic SOG | F-ADDED SiO$_2$ | 300 | 200 | $3.5 \times 10^{-4}$ | ○ | >2 | ○ |
| Organic SOG | F-ADDED SiO$_2$ | 300 | 300 | $4.0 \times 10^{-4}$ | ○ | >2 | ○ |
| Organic SOG | F-ADDED SiO$_2$ | 300 | 400 | $4.3 \times 10^{-4}$ | ○ | >2 | ○ |
| Organic SOG | F-ADDED SiO$_2$ | 300 | 800 | $5.0 \times 10^{-4}$ | ○ | >2 | ○ |
| Organic SOG | F-ADDED SiO$_2$ | 300 | 1300 | $5.1 \times 10^{-4}$ | Δ | 2 | ○ |
| Organic SOG | TEOS | 300 | 10 | $1.7 \times 10^{-4}$ | ◎ | >2 | ○ |
| Organic SOG | TEOS | 300 | 50 | $2.7 \times 10^{-4}$ | ◎ | >2 | ○ |
| Organic SOG | TEOS | 300 | 100 | $3.6 \times 10^{-4}$ | ○ | >2 | ○ |
| Organic SOG | TEOS | 300 | 200 | $4.8 \times 10^{-4}$ | ○ | >2 | ○ |
| Organic SOG | TEOS | 300 | 300 | $5.4 \times 10^{-4}$ | Δ | 2 | ○ |
| Organic SOG | SiN | 300 | 10 | $1.9 \times 10^{-4}$ | ◎ | >2 | ○ |
| Organic SOG | SiN | 300 | 30 | $2.9 \times 10^{-4}$ | ◎ | >2 | ○ |
| Organic SOG | SiN | 300 | 50 | $3.7 \times 10^{-4}$ | ○ | >2 | ○ |
| Organic SOG | SiN | 300 | 100 | $5.1 \times 10^{-4}$ | Δ | 2 | ○ |
| Organic SOG | SiN | 300 | 200 | $6.7 \times 10^{-4}$ | Δ | 2 | ○ |
| TEOS | SiN | 1600 | 600 | $8.8 \times 10^{-4}$ | Conventional product | 2 | ○ |

(Reliability of EM resistance: ◎ extremely improved from the conventional product;
○ improved from the conventional product;
Δ about the same level as the conventional product)

A method of manufacturing the semiconductor device will be explained next.

At first, a trench is formed on the first insulation film 4 formed on the TEOS-SiO$_2$ film 1. The first wiring 41 is embedded into this trench via the liner material 2 based on a damascene process. Next, the second insulation film 5 and the interlayer insulation film 42 are laminated on the first wiring 41 and the first insulation film 4. Then, the interlayer insulation film 42 and the second insulation film 5 are selectively removed by RIE or the like to provide the veer hole piercing through the first wiring 41. Then, the interlayer insulation film 42 including the area having the veer hole is selectively removed to form the trench. Subsequently, the liner material 2 is formed to cover the surface of the trench including the veer hole. Further, the second wiring 43 is embedded into this trench based on a damascene process.

Figure 4B:
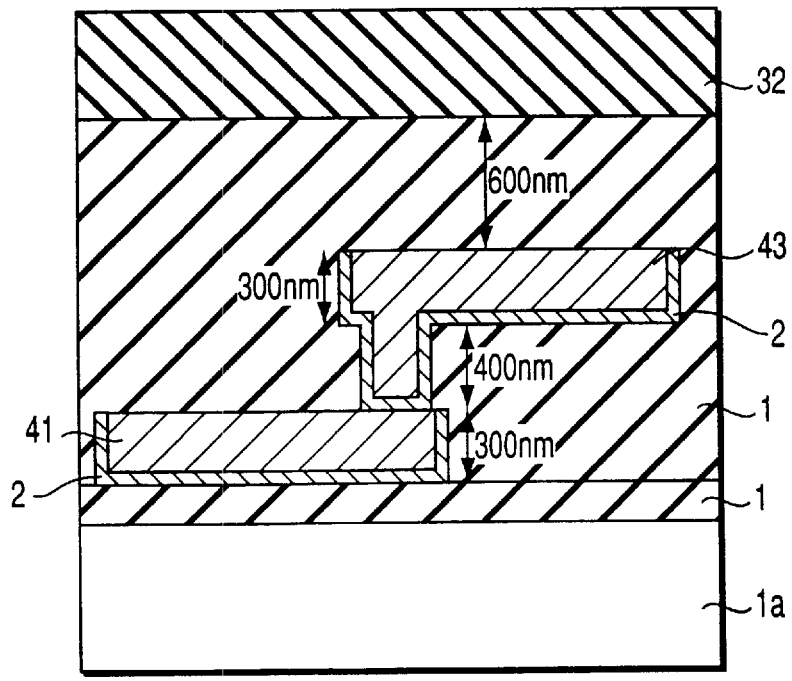
FIG. 4B is a cross sectional view of a semiconductor device for comparison with the semiconductor device of the fourth embodiment.

In the present embodiment, the first and the second wirings 41 and 43 are formed by Al. A silicon oxide film (300 nm) including an organic content is used for the first insulation film 4. An F-added SiO$_2$ film, a TEOS-SiO$_2$ film or a plasma SiN film is used for the second insulation film 5. The TEOS-SiO$_2$ film 1 and the plasma SiN 32 formed on the upper part of the second wiring 43 as passivation films have a film thickness of 600 nm respectively. It is desirable that the film thickness of the second insulation film 5 is set as follows. When the F-added SiO$_2$ film is used as the second insulation film 5, the film thickness is set to 800 nm or smaller. When the TEOS-SiO$_2$ film is used, the film For comparison with the present invention, an EM test was also carried out in a similar manner for a conventional structure having an Al wiring using the TEOS-SiO$_2$ film 1 for the whole interlayer insulation films. FIG. 4B shows a cross sectional view of this comparative example. The structure of FIG. 4B is different from that of the present embodiment only in that the interlayer film is formed by using the TEOS-SiO$_2$ film in place of the first insulation film 4, the second insulation film 5 and the interlayer insulation film 42.

For the film thickness dM of the wiring, the film thickness (300 nm) of the first wiring 41 was assumed. For the film thickness ds of the first insulation film 4 having a Young's modulus of 15 GPa or lower, the film thickness (300 nm) of the silicon oxide film including an organic content between the wiring of the first wiring 41 was assumed. For the film thickness dh of the second insulation film 5, the film thickness of any one of the F-added SiO$_2$ film, the TEOS-SiO$_2$ film and the plasma SiN film between the first and second wirings 41 and 43 was assumed.

MTF was evaluated based on the wiring that uses the TEOS-SiO$_2$/SiN laminated film as shown in FIG. 4B as the interlayer insulation film.

When only the silicon oxide film including an organic content was formed on the wiring 41, the MTF improved extremely from that of the conventional product, and the n-value was larger than two, as shown in Table 5. However, a crack occurred in this case. When the second insulation film 5 was formed in a film thickness of 10 nm on the first insulation film 4, it was possible to prevent the occurrence of a crack. When the film thickness of the second insulation film 5 was gradually changed, there occurred no crack in the structure having the s-value of $5 \times 10^{-4}$ or larger. However, both the MTF and the n-value were about the same as those of the conventional product. In the wiring structure having the s-value smaller than $5 \times 10^{-4}$, the MTF improved by 20% or more from that of the conventional product, and the n-value was larger than two. Further, when the s-value equals to or smaller than $3.5 \times 10^{-4}$, the n-value was also larger than two, and the MTF improved by 60% or more from that of the conventional product.

Fifth Embodiment

Figure 5A:
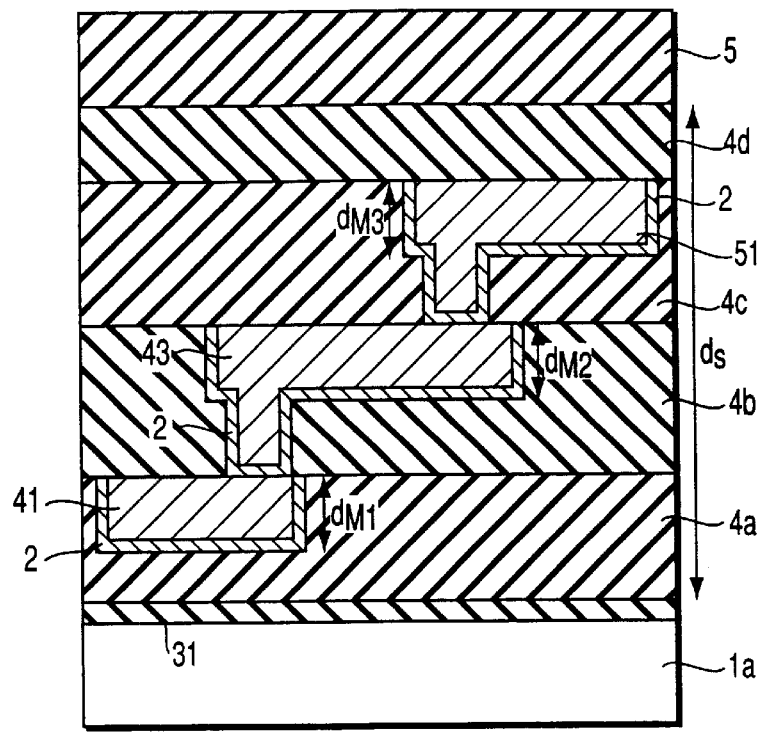
FIG. 5A is a cross sectional view of a semiconductor device according to a fifth embodiment of the present invention.

FIG. 5A is a cross sectional view of a semiconductor device according to a fifth embodiment of the present invention. In the present embodiment, an description will be made of a case where, in a multilayer wiring, an insulation film having a Young's modulus of 15 GPa or lower is used both between wirings and between layers.

As shown in FIG. 5A, an interlayer insulation film 4a is formed on a thermally-oxidized $SiO_2$ film 31 on a substrate 1a. A trench of a predetermined thickness is formed on the interlayer insulation film 4a. A first wiring 41 is embedded into this trench via a liner material 2. An interlayer insulation film 4b is formed on the first wiring 41 and the interlayer insulation film 4a. On the interlayer insulation film 4b, there are formed a trench of a predetermined depth and a veer hole piercing through the first wiring 41. A second wiring 43 is embedded into this trench and the veer hole via the liner material 2.

An interlayer insulation film 4c is formed on the second wiring 43 and the interlayer insulation film 4b. On this interlayer insulation film 4c, there are formed a trench of a predetermined depth and a veer hole piercing through the second wiring 43. A third wiring 51 is formed on this trench and the veer hole. Further, on the third wiring 51 and the interlayer insulation film 4c, there is formed a second insulation film 5 as a passivation film via an interlayer insulation film 4d. The interlayer insulation films 4a to 4d form a first insulation film 4. Each of the first to the third wirings 41, 43 and 51 has a film thickness of 400 nm.

Parameters of the wiring 3, the first insulation film 4 and the second insulation film 5 are formed respectively to satisfy the Expression (4) shown in the first embodiment.

A method of manufacturing the semiconductor device will be explained next. A detailed description of portions common to those of the fourth embodiment will be omitted. In the present embodiment, the first wiring 41 is formed using Al based on a damascene process. The veer holes and the second and third wirings 43 and 51 are formed based on a dual damascene process.

For the interlayer insulation films 4a to 4d that structure the first insulation film 4, there is used the silicon oxide film including an organic content as described in the first embodiment. It is desirable that the total film thickness of the first insulation film 4 is 2,800 nm, and a plasma SiN film is used for the second insulation film 5 in the film thickness of 800 nm.

Next, for the semiconductor device manufactured in the above-described process, an experiment was carried out by variously changing the film thickness and the material of the second insulation film under conditions similar to those of the preceding embodiment. Table 6 shows film thickness of the insulation films 4 and 5, s-values, MTFs, current density coefficients n, and crack resistances obtained as a result of the experiment.

TABLE 6

| First insulation film | Second insulation film | ds (nm) | dh (nm) | s | MTF | n | Crack resistance |
|---|---|---|---|---|---|---|---|
| Organic SOG | SiN | 2800 | 0 | $1.3 \times 10^{-4}$ | ◉ | >2 | X |
| Organic SOG | SiN | 2800 | 10 | $1.4 \times 10^{-4}$ | ◉ | >2 | ○ |
| Organic SOG | SiN | 2800 | 200 | $2.5 \times 10^{-4}$ | ◉ | >2 | ○ |
| Organic SOG | SiN | 2800 | 400 | $3.4 \times 10^{-4}$ | ◉ | >2 | ○ |
| Organic SOG | SiN | 2800 | 500 | $3.8 \times 10^{-4}$ | ○ | >2 | ○ |
| Organic SOG | SiN | 2800 | 800 | $4.8 \times 10^{-4}$ | ○ | >2 | ○ |
| Organic SOG | SiN | 2800 | 1000 | $5.2 \times 10^{-4}$ | Δ | 2 | ○ |
| TEOS | SIN | 2800 | 600 | $8.5 \times 10^{-4}$ | Conventional product | 2 | ○ |

The EM was tested for each of the first to the third wirings 41, 43 and 51 in the semiconductor device of the present embodiment.

Figure 5B:
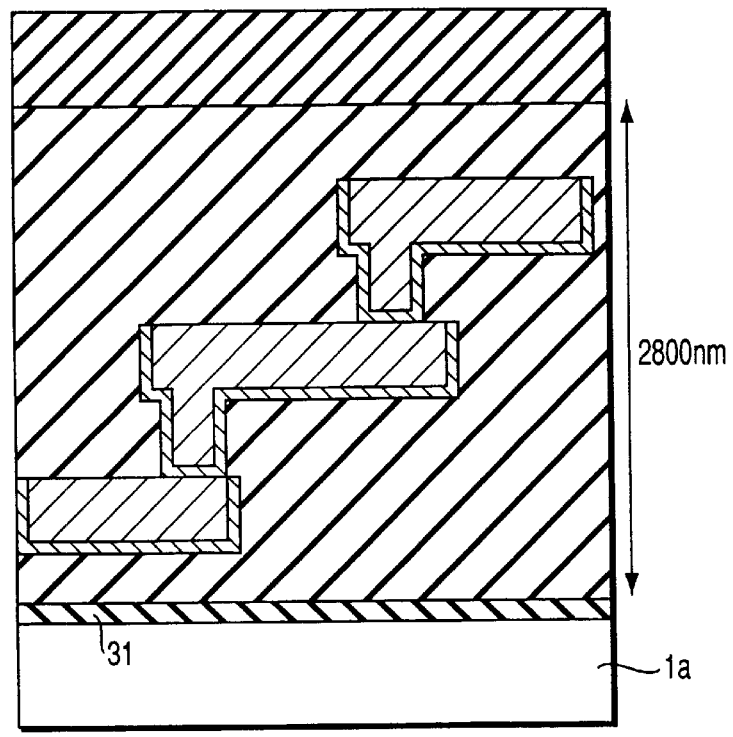
FIG. 5B is a cross sectional view of a semiconductor device for comparison with the semiconductor device of the fifth embodiment.

For comparison with the present invention, an EM test was also carried out in a similar manner for a conventional structure having an Al wiring using a $TEOS-SiO_2$ film for the whole interlayer insulation films. FIG. 5B shows a cross sectional view of this comparative example. The structure of FIG. 5B is different from that of the present embodiment only in that the interlayer film is formed by using the $TEOS-SiO_2$ film 1 in place of the first insulation film 4. The film thickness of the $TEOS-SiO_2$ film 1 is 2,800 nm.

For the film thickness dM of the wiring, the total film thickness (1,200 nm) of the first to the third wirings 41, 43 and 51 was assumed. For the film thickness ds of the first insulation film 4 having a Young's modulus of 15 GPa or lower, the total film thickness (2,800 nm) of the interlayer insulation films 4a to 4d was assumed. For the film thickness dh of the second insulation film 5, the film thickness of the plasma SiN film was assumed. MTF was evaluated based on the wiring that uses the $TEOS-SiO_2/SiN$ laminated film shown in FIG. 5B as the interlayer insulation film for the semiconductor device.

When only the first insulation film 4 was formed, the MTF improved extremely from that of the conventional product, and the n-value was larger than two, as shown in Table 6. However, a crack occurred in this case. When the second insulation film 5 was formed in a film thickness of 10 nm on the first insulation film 4, it was possible to prevent the occurrence of a crack. When the film thickness of the second insulation film 5 was gradually changed, there occurred no crack in the structure having the s-value of $5 \times 10^{-4}$ or larger. However, both the MTF and the n-value were about the same as those of the conventional product. In the wiring structure having the s-value smaller than $5 \times 10^{-4}$, the MTF improved by 20% or more from that of the conventional product, and the n-value was larger than two. Further, when the s-value equals to or smaller than $3.5\times10^{-4}$, the n-value was also larger than two, and the MTF improved by 60% or more from that of the conventional product.

A similar result was also obtained when the second layer wiring and the third layer wiring were tested.

Sixth Embodiment

Figure 6A:
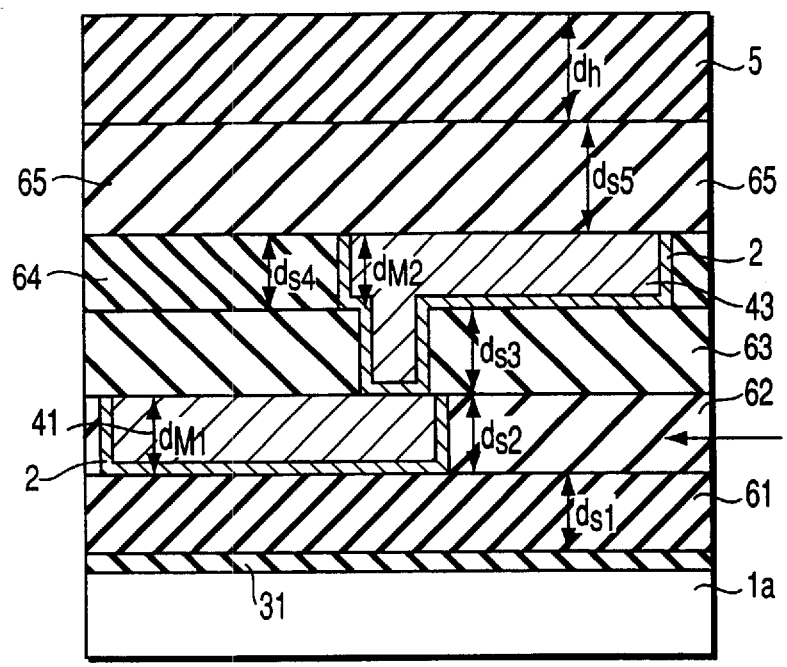
FIG. 6A is a cross sectional view of a semiconductor device according to a sixth embodiment of the present invention.

FIG. 6A is a cross sectional view of a semiconductor device according to a sixth embodiment of the present invention. In the present embodiment, an description will be made of a case where, in a multilayer wiring, an insulation film used between wiring and an insulation film used between layers are of different materials, but both insulation films have a Young's modulus of 15 GPa or lower.

As shown in FIG. 6A, interlayer insulation films 61 and 62 are laminated on a thermally-oxidized $SiO_2$ film 31 on a substrate 1a. A trench is formed on the interlayer insulation film 62. A first wiring 41 is embedded into this trench.

satisfy the condition of the gradient s expressed in the Expression (4) is not larger than $5\times10^{-4}$.

In the present embodiment, the first wiring 41 is formed using Al based on a damascene process. The veer hole and the second wiring 43 are formed based on a dual damascene process. It is desirable that the second insulation film 5 is formed in the thickness of 500 nm. A method of manufacturing other parts is common to that of the preceding embodiment, and this will not be explained.

Next, for the semiconductor device manufactured in the above-described process, an experiment was carried out by variously changing the film thickness and the material of the second insulation film under conditions similar to those of the preceding embodiment. Table 7 shows film thickness of the insulation films 4 and 5, s-values, MTFs, current density coefficients n, and crack resistances obtained as a result of the experiment.

TABLE 7

| First insulation film | Second insulation film | ds (nm) | dh (nm) | s | MTF | n | Crack resistance |
|---|---|---|---|---|---|---|---|
| Organic SOG & polyimide | SiN | 1800 | 0 | $1.2 \times 10^{-4}$ | ⊙ | >2 | X |
| Organic SOG & polyimide | SiN | 1800 | 10 | $1.3 \times 10^{-4}$ | ⊙ | >2 | ○ |
| Organic SOG & polyimide | SiN | 1800 | 200 | $3.0 \times 10^{-4}$ | ⊙ | >2 | ○ |
| Organic SOG & polyimide | SiN | 1800 | 300 | $3.6 \times 10^{-4}$ | ○ | >2 | ○ |
| organic SOG & polyimide | SiN | 1800 | 500 | $4.7 \times 10^{-4}$ | ○ | >2 | ○ |
| Organic SOG & polyimide | SiN | 1800 | 600 | $5.1 \times 10^{-4}$ | Δ | 2 | ○ |
| Organic SOG & polyimide | SiN | 1800 | 800 | $5.7 \times 10^{-4}$ | Δ | 2 | ○ |
| TEOS | SiN | 1800 | 600 | $8.8 \times 10^{-4}$ | Conventional product | 2 | ○ |

(Reliability of EM resistance: ⊙ extremely improved from the conventional product;
○ improved from the conventional product;
Δ about the same level as the conventional product)

Inter-layer insulation films 63 and 64 are laminated on the first wiring 41 and the interlayer insulation film 62. A veer hole is formed piercing through the interlayer insulation films 63 and 64 to reach the first wiring 41. Further, a trench is formed in an area including this veer hole on the interlayer insulation film 64. A second wiring 43 is embedded into this trench including this veer hole. On the second wiring 43 and the interlayer insulation film 64, there are laminated an interlayer insulation film 65 and a second insulation film 5 as a passivation film. A liner material 2 is formed on a bottom surface and side surfaces of the first wiring and on a bottom surface and side surfaces of the second wiring respectively. In the present embodiment, the interlayer insulation films 61 to 65 form a first insulation film 4.

Each of the first and second wirings 41 and 43 has a film thickness of 300 nm. For each of the interlayer insulation films 62 and 64 provided at the side portion of the wirings 41 and 43 respectively, there is used a silicon oxide film including an organic content having a film thickness of 300 nm. For each of the interlayer insulation films 61 and 63, there is used a polyimide film having a film thickness of 400 nm. A plasma SiN film is used for the second insulation film 5.

Parameters of the wiring 41, the first insulation film 4 and the second insulation film 5 are formed respectively to The EM was tested for each of the first and second wirings 41 and 43 in the semiconductor device of the present embodiment.

Figure 6B:
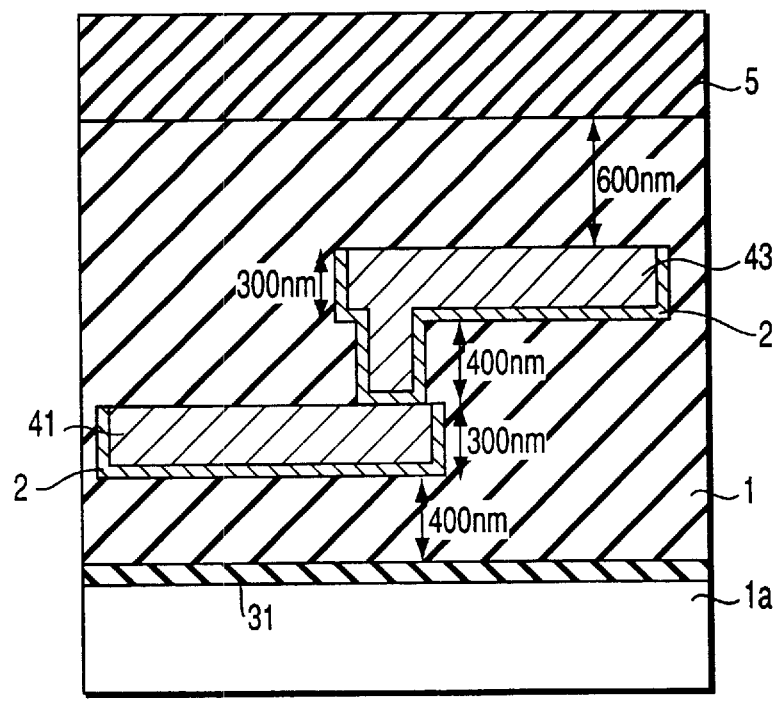
FIG. 6B is a cross sectional view of a semiconductor device for comparison with the semiconductor device of the sixth embodiment.
Figure 7A:
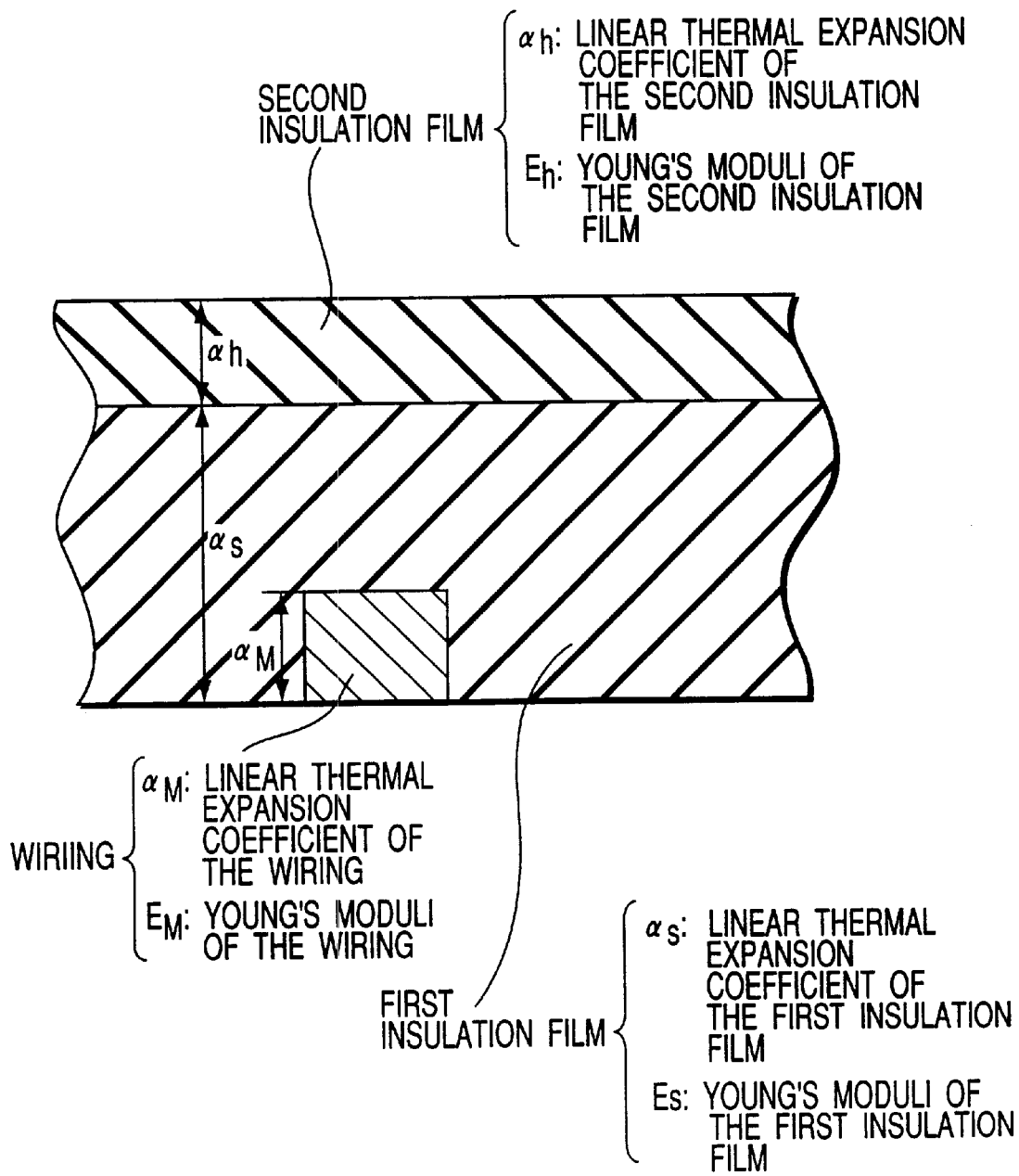
FIGS. 7A and 7B are a cross sectional view of a typical semiconductor device of the invention.
Figure 7B:
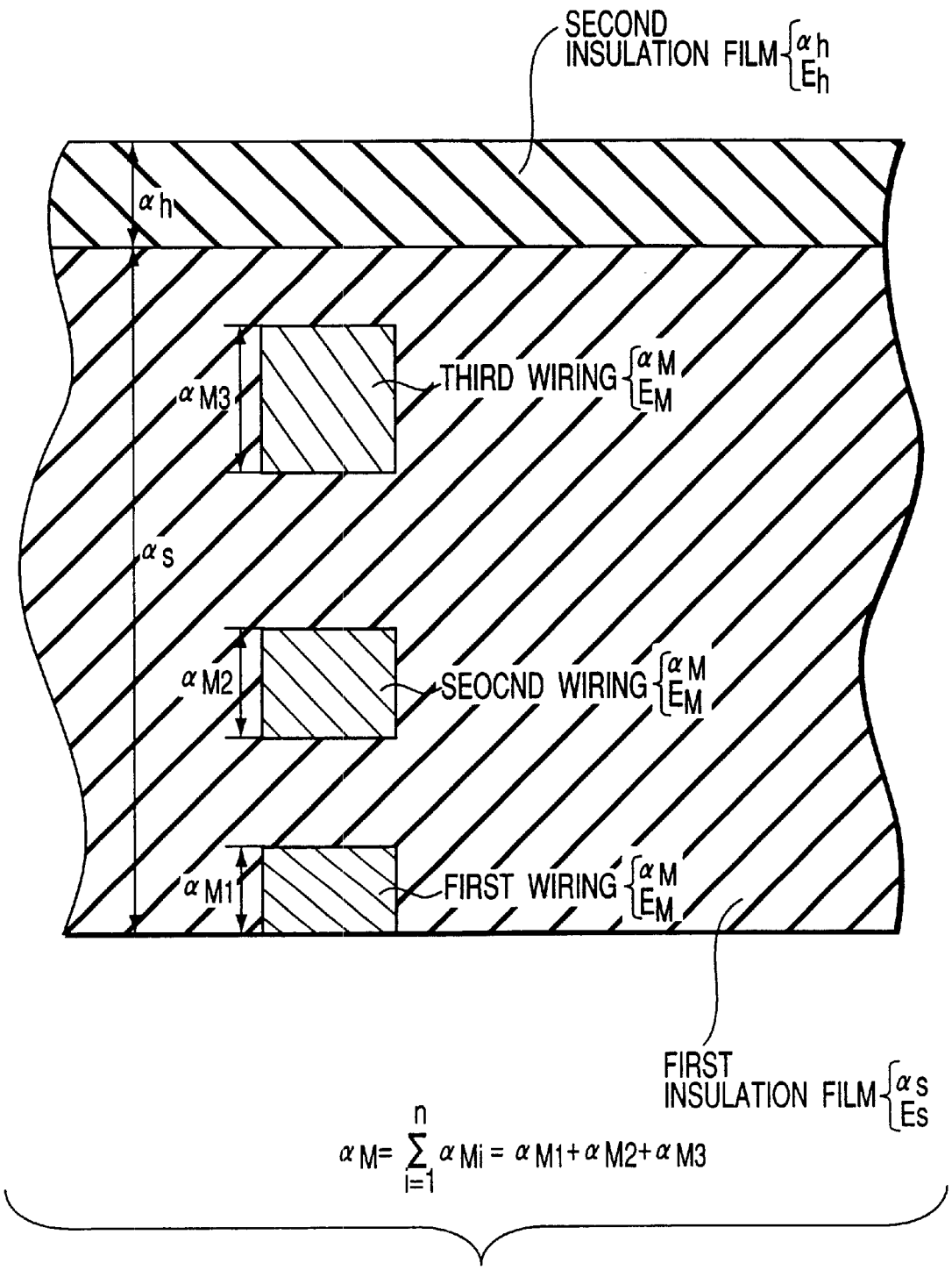

For comparison with the present invention, an EM test was also carried out in a similar manner for a conventional structure having an Al wiring using a $TEOS-SiO_2$ film for the whole interlayer insulation films. FIG. 6B shows a cross sectional view of this comparative example. The structure of FIG. 6B is different from that of the present embodiment only in that the interlayer film is formed by using the $TEOS-SiO_2$ film 1 in place of the first insulation film 4. The film thickness of the $TEOS-SiO_2$ film 1 is 1,800 nm.

For the film thickness dM of the wiring, the total film thickness (600 nm) of the first and second wirings 41 and 43 was assumed. The film thickness ds of the first insulation film 4 having a Young's modulus of 15 GPa or lower, the combined Young's modulus, and the coefficient of linear thermal expansion αs are defined by the following expressions respectively.

$$ds = ds1+ds2+ds3+ds4+ds5 Es = (ds1Es1+ds2Es2+ds3Es3+ds4Es4+ds5Es5)/ds \quad \alpha s1 = (ds1\alpha s1+ds2\alpha s2+ds3\alpha s1+ds4\alpha s2+ds5\alpha s1)/ds$$

In the above, ds1 to ds5 represent film thickness of the interlayer insulation films 61 to 65 respectively. Es1 to Es2 represent Young's moduli of the interlayer insulation films 61 to 65 respectively. $\alpha s1$ to $\alpha s2$ represent coefficients of linear thermal expansion of the interlayer insulation films 61 to 65 respectively. In the present embodiment, the Young's modulus of the polyimide film is 5.2 GPa, and the coefficient of linear thermal expansion is $10^{-5}$.

From the above expressions, the ds is equal to 1,800 nm, Es is equal to 5 GPa, and $\alpha s$ is equal to $10^{-5}$. For the film thickness dh of the second insulation film 5, the film thickness of the plasma SiN film was assumed. MTF was evaluated based on the wiring that uses the TEOS-SiO$_2$/SiN laminated film shown in FIG. 6B as the interlayer insulation film.

When only the first insulation film 4 was formed, the MTF improved extremely from that of the conventional product, and the n-value was larger than two, as shown in Table 7. However, a crack occurred in this case. When the second insulation film 5 was formed in a film thickness of 10 nm on the first insulation film 4, it was possible to prevent the occurrence of a crack. When the film thickness of the second insulation film 5 was gradually changed, there occurred no crack in the structure having the s-value of $5\times10^{-4}$ or larger. However, both the MTF and the n-value were about the same as those of the conventional product. In the wiring structure having the s-value smaller than $5\times10^{-4}$, the MTF improved by 20% or more from that of the conventional product, and the n-value was larger than two. Further, when the s-value equals to or smaller than $3.5\times10^{-4}$, the n-value was also larger than two, and the MTF improved by 60% or more from that of the conventional product.

A similar result was also obtained when the second wiring was tested.

Seventh Embodiment

In the present embodiment, an description will be made of a case where Cu or a Cu alloy is used as the wiring material.

An experiment was carried out by substituting the Al wiring for a Cu wiring in the structure of the first embodiment. Table 8 shows film thickness of the insulation films 4 and 5, s-values, MTFs, current density coefficients n, and crack resistances obtained as a result of the experiment.

From a result of measurements, when Cu was used for the wiring, k1 was equal to 1.2, and k2 was equal to $10^{-3}$. TiN or TaN was used as a liner material and a barrier metal on an upper surface of the wiring. The film thickness dM of the wiring was 400 nm which is a total film thickness of the liner material, a barrier layer on the upper surface of the wiring and the Cu film. For the Young's modulus (EM) and the coefficient of linear thermal expansion (aM) of the wiring material, the physical properties of the Cu were used ($E_M=$ 126 GPa, and $\alpha M=1.7\times10^{-5}$). MTF was evaluated based on the wiring that uses the TEOS-SiO$_2$/SiN laminated film as the interlayer insulation film.

As shown in Table 8, when only the first insulation film 4 was formed, the MTF improved extremely from that of the conventional product, and the n-value was larger than two. However, a crack occurred in this case. When the second insulation film 5 was formed in a film thickness of 10 nm on the first insulation film 4, it was possible to prevent the occurrence of a crack. When the film thickness of the second insulation film 5 was gradually changed, there occurred no crack in the structure having the s-value of $5\times10^{-4}$ or larger. However, both the MTF and the n-value were about the same as those of the conventional product. In the wiring structure having the s-value smaller than $5\times10^{-4}$, the MTF improved by 20% or more from that of the conventional product, and the n-value was larger than two. Further, when the s-value equals to or smaller than $3.5\times10^{-4}$, the n-value was also larger than two, and the MTF improved by 60% or more from that of the conventional product.

From the above, the film thickness of the second insulation film 5 is determined as follows. When the F-added SiO$_2$ film is used as the second insulation film 5, the film thickness is 800 nm or smaller. When the TEOS-SiO$_2$ film is used, the film thickness is 200 nm or smaller. When the plasma SiN film is used, the film thickness is set to 100 nm or smaller.

When Cu or a Cu alloy was used for the wiring material in each of the second to sixth embodiments described above, effects similar to those of the Al wiring were obtained. In the case of the Cu wiring, a barrier layer exists between the wiring and an insulation film in contact with this wiring. In calculating the s-value, when the barrier layer is a conductive film, the film thickness of this barrier layer was added

TABLE 8

| First insulation film | Second insulation film | ds (nm) | dh (nm) | s | MTF | n | Crack resistance |
|---|---|---|---|---|---|---|---|
| Organic SOG | F-ADDED SiO$_2$ | 400 | 0 | $1.3 \times 10^{-4}$ | ⊚ | >2 | X |
| Organic SOG | F-ADDED SiO$_2$ | 400 | 10 | $1.5 \times 10^{-4}$ | ⊚ | >2 | ○ |
| Organic SOG | F-ADDED SiO$_2$ | 400 | 100 | $2.8 \times 10^{-4}$ | ⊚ | >2 | ○ |
| Organic SOG | F-ADDED SiO$_2$ | 400 | 200 | $3.5 \times 10^{-4}$ | ⊚ | >2 | ○ |
| Organic SOG | F-ADDED SiO$_2$ | 400 | 300 | $4.0 \times 10^{-4}$ | ○ | >2 | ○ |
| Organic SOG | F-ADDED SiO$_2$ | 400 | 400 | $4.3 \times 10^{-4}$ | ○ | >2 | ○ |
| Organic SOG | F-ADDED SiO$_2$ | 400 | 800 | $5.0 \times 10^{-4}$ | ○ | >2 | ○ |
| Organic SOG | F-ADDED SiO$_2$ | 400 | 1300 | $5.1 \times 10^{-4}$ | Δ | 2 | ○ |
| Organic SOG | TEOS | 400 | 10 | $1.7 \times 10^{-4}$ | ⊚ | >2 | ○ |
| Organic SOG | TEOS | 400 | 50 | $2.7 \times 10^{-4}$ | ⊚ | >2 | ○ |
| Organic SOG | TEOS | 400 | 100 | $3.6 \times 10^{-4}$ | ○ | >2 | ○ |
| Organic SOG | TEOS | 400 | 200 | $4.8 \times 10^{-4}$ | ○ | >2 | ○ |
| Organic SOG | TEOS | 400 | 300 | $5.4 \times 10^{-4}$ | Δ | 2 | ○ |
| Organic SOG | SiN | 400 | 10 | $1.6 \times 10^{-4}$ | ⊚ | >2 | ○ |
| Organic SOG | SiN | 400 | 50 | $2.9 \times 10^{-4}$ | ⊚ | >2 | ○ |
| Organic SOG | SiN | 400 | 100 | $4.2 \times 10^{-4}$ | ○ | 2 | ○ |
| Organic SOG | SiN | 400 | 200 | $5.8 \times 10^{-4}$ | Δ | 2 | ○ |
| TEOS | SiN | 600 | 600 | $9.9 \times 10^{-4}$ | Conventional product | 2 | ○ |

(Reliability of EM resistance: ⊚ extremely improved from the conventional product;
○ improved from the conventional product;
Δ about the same level as the conventional product)

to the film thickness of the wiring. When the barrier layer is an insulation material, this film thickness was added to the film thickness of the insulation film.

In the present embodiment, an description will be made of a case where Cu or a Cu alloy is used as the wiring material, and in this case, all the wiring material is Cu or a Cu alloy. However, the present invention is not limited to this. Cu or a Cu alloy may be used as a part of the wiring material, and Al or a Al alloy may be used as another part of the wiring material.

The present invention is not limited to the above-described embodiments.

It is also possible to obtain similar effects to those explained above when a silicon oxide film including an organic content is used which is manufactured by methods other than the spin coating, such as, for example, a CVD method, a deposition polymerization method, a sputtering method, or the like. The silicon oxide film including an organic content may also. include Ti, zirconia or Al metal oxide as an additive.

Although a description has been made of a case where the first insulation film and the second insulation film are formed on the main surface of the substrate 1a, the invention is not limited to this. For example, it is of course possible to form on the main surface of the substrate 1a a structure which is obtained by reversing the up and down relation of the parts other than the substrate 1a in FIG. 1 to FIG. 6.

When Ti, TiN, Ta or TaAl was used other than Nb for the liner material, it was also possible to obtain similar effects.

As described in detail in the above, according to the present invention, a first insulation film is formed on a wiring in contact with the wiring. Further, on this first insulation film, a second insulation film having a higher Young's modulus than that of the first insulation film is formed in contact with the first insulation film. Parameters are suitably determined so that the gradient of temperature of the stress working on the wiring becomes $s<5\times10^{-4}$. As a result, it is possible to extremely improve the reliability of EM resistance while holding the crack resistance of the wiring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a wiring including a main component formed of a wiring material and at least one conductive layer formed in contact with at least one of an upper surface and a lower surface of the main component;
   a first interlayer insulation film formed in contact with at least one surface of the wiring; and
   a second interlayer insulation film formed on the first interlayer insulation film in contact with the first interlayer insulation film and having a higher Young's modulus than that of the first interlayer insulation film, wherein
   when the main component of the wiring, the first interlayer insulation film and the second interlayer insulation film have coefficients of linear thermal expansion $\alpha_M$, $\alpha_s$ and $\alpha_h$ respectively and Young's moduli $E_M$, $E_s$ and $E_h$ respectively, and the wiring, the first interlayer insulation film and the second interlayer insulation film have coefficients of film thickness $d_M$, $d_s$ and $d_h$ respectively, and when coefficients determined by said wiring material are expressed as $k_1$, $k_2$, when it is defined that $d_I=d_s+d_h$, $E_I=(d_sE_s+d_hE_h)d_I$, and $\alpha_I=(d_s\alpha_s+d_h\alpha_h)/d_I$, and also when a gradient of the stress working on the wiring depending on temperature is expressed as s, the wiring, the first interlayer insulation film and the second interlayer insulation film respectively satisfy a condition given by the following expression:

$$s = k_1 \frac{E_M E_I}{E_M + E_I} \cdot \left(\alpha_M - k_2\alpha_I \frac{d_I}{d_M}\right) < 5 \times 10^{-4}.$$

2. A semiconductor device according to claim 1, wherein the first interlayer insulation film is formed by a material having a Young's modulus of 15 GPa or lower, and the second interlayer insulation film is formed by a material having a Young's modulus higher than 15 GPa.

3. A semiconductor device according to claim 1, wherein the first interlayer insulation film is a laminated film made of different materials and is characterized by the following expression when $d_{si}$ represents a film thickness, $E_{si}$ represents a Young's modulus, and $\alpha_{si}$ represents a coefficient of linear thermal expansion of an i-th insulation film starting from a side of the wiring respectively:

$$d_s = \sum_i d_{si}$$

$$E_s = \left(\sum_i d_{si}E_{si}\right)\bigg/d_s$$

$$\alpha_s = \left(\sum_i d_{si}a_{si}\right)\bigg/d_s.$$

4. A semiconductor deice according to claim 1, wherein the first interlayer insulation film has at least one layer of a film having silicon oxide as a main component including an organic material.

5. A semiconductor device according to claim 1, wherein the first interlayer insulation film has at least one layer of a film having silicon oxide as a main component including an organic content, and the organic materials includes methyl group as a main component.

6. A semiconductor device according to claim 1, further comprising:
   a substrate, wherein
      the wiring is formed on a main surface of the substrate via at least an insulation layer, and
      the first interlayer insulation film is formed in contact with an upper surface or a lower surface of the wiring.

7. A semiconductor device according to claim 1, further comprising:
   a substrate, wherein
      the wiring is formed on a main surface of the substrate via at least an insulation layer, and
      the first interlayer insulation film is formed in contact with an upper surface or a lower surface and side surfaces of the wiring.

8. A semiconductor device according to claim 1, further comprising:
   a substrate, wherein the wiring is formed on a main surface of the substrate via at least an insulation layer, and the first interlayer insulation film is formed in contact with side surfaces, an upper surface and a lower surface of the wiring.

9. A semiconductor device according to claim 1, further comprising:

a substrate, wherein
the wiring is formed on a main surface of the substrate via at least an insulation layer and includes a first wiring and a second wiring formed on mutually different layers on the main surface of the substrate,
the first interlayer insulation film is an insulation film formed on side surfaces of the first wiring,
the main component of the first wiring has the coefficient of linear thernal expansion $\alpha_M$ and the Young's modulus $E_M$, and the first wiring has the coefficient of the film thickness $d_M$, and the coefficients $k_1$ and $k_2$ are determined by a material structuring the main component of the first wiring.

10. A semiconductor device according to claim 1, further comprising:

a substrate, wherein
the wiring is formed on a main surface of the substrate via at least an insulation layer and includes a first wiring and a second wiring formed on mutually different layers on the main surface of the substrate,
the first interlayer insulation film is a insulation film formed on side surfaces of the first wiring,
the second interlayer insulation film is an insulation film formed between the first wiring and the second wiring,
the main component of the first wiring has the coefficient of linear thermal expansion $\alpha_M$ and the Young's modulus $E_M$, and the first wiring has the coefficient of the film thickness $d_M$, and the coefficients $k_1$ and $k_2$ are determined by a material structuring the main component of the first wiring, and
the first interlayer insulation film is formed by a material having a Young's modulus of 15 GPa or lower, and the second interlayer insulation film is formed by a material having a Young's modulus higher than 15 GPa.

11. A semiconductor device comprising:

a substrate;
a first interlayer insulation film formed on the substrate through at least an insulation layer,
a first wiring, a second wiring and a third wiring selectively formed on the first interlayer insulation film, wherein each of the first wiring, the second wiring and the third wiring includes a main component formed of a wiring material and at least one conductive layer formed in contact with at least one of an upper surface and a lower surface of the main component; and
a second interlayer insulation film formed on the first insulation interlayer film in contact with the first interlayer insulation film and having a higher Young's modulus than that of the first interlayer insulation film, wherein
the first wiring, the second wiring and the third wiring are formed on mutually different layers of the first interlayer insulation film, and
when the main components of the first to the third wirings, the first interlayer insulation film and the second interlayer insulation film have coefficients of linear thermal expansion $\alpha_M$, $\alpha_s$ and $\alpha_h$ respectively and Young's moduli $E_M$, $E_s$, and $E_h$ respectively, when a sum of film thickness of the first to the third wirings, a film thickness of the first interlayer insulation film and a film thickness of the second interlayer insulation film are expressed as $d_M$, $d_s$ and $d_h$ respectively, when coefficients determined by materials that structure the main components of the first to the third wirings are expressed as $k_1$, $k_2$, when it is defined that $d_I=d_s+d_h$, $E_I=(d_sE_s+d_hE_h)/d_I$, and $\alpha_I=(d_s\alpha_s+d_h\alpha_h)/d_I$, and also when a gradient of the stress working on the first to the third wirings depending on temperature is expressed as s, the first to the third wirings, the first interlayer insulation film and the second interlayer insulation film respectively satisfy a condition given by the following expression:

$$s = k_1 \frac{E_M E_I}{E_M + E_I} \cdot \left( \alpha_M - k_2 \alpha_I \frac{d_I}{d_M} \right) < 5 \times 10^{-4}.$$

12. A semiconductor device according to claim 11, wherein the first interlayer insulation film is formed by a material having a Young's modulus of 15 GPa or lower, and the second interlayer insulation film is formed by a material having a Young's modulus higher than 15 GPa.

13. A semiconductor device according to claim 11, wherein insulation films of the first interlayer insulation film formed on side surfaces of the first to the third wirings and insulation films of the first interlayer insulation film formed between the first to the third wirings are of different materials.

14. A semiconductor device according to claim 1, wherein the wiring material is Al, the coefficient $k_1$ is equal to 1, and the coefficient $k_2$ is equal to $1.0 \times 10^{-3}$.

15. A semiconductor device according to claim 1, wherein the wiring material is Cu, the coefficient $k_1$ is equal to 1.2, and the coefficient $k_2$ is equal to $1.0 \times 10^{-3}$.

16. A semiconductor device according to claim 11, wherein a wiring material of at least one of the main components of the first to the third wiring is Al, the coefficient $k_1$ is equal to 1, and the coefficient $k_2$ is equal to $1.0 \times 10^{-3}$.

17. A semiconductor device according to claim 11, wherein a wiring material of at least one of the main components of the first to the third material is Cu, the coefficient $k_1$ is equal to 1.2, and the coefficient $k_2$ is equal to $1.0 \times 10^{-3}$.

18. A semiconductor device comprising:

a wiring including a main component formed of Cu and at least one conductive layer formed in contact with at least one of an upper surface and a lower surface of the main component;
a first insulation film formed in contact with at least one surface of the wiring; and
a second insulation film formed on the first insulation film in contact with the first insulation film and having a higher Young's modulus than that of the first insulation film, wherein
when the main component of the wiring, the first insulation film and the second insulation film have coefficients of linear thermal expansion am, as and ah respectively and Young's moduli $E_M$, $E_s$ and $E_h$ respectively, and the wiring, the first insulation film and the second insulation film have coefficients of film thickness $d_M$, $d_s$ and $d_h$ respectively, and when it is defined that $d_I=d_s+d_h$, $E_I=(d_sE_s+d_hE_h)/d_I$, and $\alpha_I=(d_s\alpha_s+d_h\alpha_h)/d_I$, and also when a gradient of the stress working on the wiring depending on temperature is expressed as s, the wiring, the first insulation film and the second insulation film respectively satisfy a condition given by the following expression.

$$s = (1.2)\frac{E_M E_I}{E_M + E_I} \cdot \left(\alpha_M - (1.0 \times 10^{-3})\alpha_I \frac{d_I}{d_M}\right) < 5 \times 10^{-4}.$$

19. A semiconductor device according to claim 18, wherein the first insulation film is formed by a material having a Young's modulus of 15 GPa or lower, and the second insulation film is formed by a material having a Young's modulus higher than 15 GPa.

20. A semiconductor device according to claim 18, wherein the first insulation film is a laminated film made of different materials and is characterized by the following expression when $d_{si}$ represents a film thickness, $E_{si}$ represents a Young's modulus, and $\alpha_{si}$ represents a coefficient of linear thermal expansion of an i-th insulation film starting from a side of the wiring rspectively:

$$d_s = \sum_i d_{si}$$

$$E_s = \left(\sum_i d_{si} E_{si}\right)/d_s$$

$$\alpha_s = \left(\sum_i d_{si} \alpha_{si}\right)/d_s.$$

21. A semiconductor device according to claim 18, wherein the first insulation film has at least one layer of a film having silicon oxide as a main component including an organic material.

22. A semiconductor device according to claim 18, wherein the first insulation film has at least one layer of a film having silicon oxide as a main component including an organic content, and the organic material includes methyl group as a main component.

23. A semiconductor device according to claim 18, further comprising:
a substrate, wherein
the wiring is formed on a main surface of the substrate via at least an insulation layer, and
the first insulation film is formed in contact with an upper surface or a lower surface of the wiring.

24. A semiconductor device ac to comprising:
a substrate, wherein
the wiring is formed on a main surface of the substrate via at least an insulation layer, and
the first insulation film is formed in contact with an upper surface or a lower surface and side surfaces of the wiring.

25. A semiconductor device according to claim 18, further comprising:
a substrate, wherein
the wiring is formed on a main surface of the substrate via at least an insulation layer, and
the first insulation film is formed in contact with side surfaces, an upper surface and a lower surface of the wiring.

26. A semiconductor device according to claim 18, wherein the first insulation film is formed in contact with a lower surface of the wiring.

27. A seiconductor device comprising:
a wiring including a main component formed of a wiring material and at least one conductive layer formed in contact with at least one of an upper surface and a lower surface of the main component;
a first insulation film formed in contact with a lower surface of the wiring; and
a second insulation film formed on the first insulation film in contact with the first insulation film and having a higher Young's modulus than that of the first insulation film, wherein
when the main component of the wiring, the first insulation film and the second insulation film have coefficients of linear thermal expansion $\alpha_M$, $a_s$ and $\alpha_h$ respectively and Young's moduli $E_M$, $E_s$ and $E_h$ respectively, and film thickness of the wiring, the first insulation film and the second insulation film are expressed as $d_M$, $d_s$ and $d_h$ respectively, and when coefficients determined by said wiring material are expressed as $k_1$, $k_2$, when it is defined that $d_I = d_s + d_h$, $E_I = (d_s E_s + d_h E_h)/d_I$, and $\alpha_I = (d_s \alpha_s + d_h \alpha_h)/d_I$, and also when a gradient of the stress working on the wiring depending on temperature is expressed as s, the wiring, the first insulation film and the second insulation film respectively satisfy a condition given by the following expression:

$$s = k_1 \frac{E_M E_I}{E_M + E_I} \cdot \left(\alpha_M - k_2 \alpha_I \frac{d_I}{d_M}\right) < 5 \times 10^{-4}.$$

28. A semiconductor device according to claim 27, wherein the first insulation film is formed by a material having a Young's modulus of 15 GPa or lower, and the second insulation film is formed by a material having a Young's modulus higher than 15 GPa.

29. A semiconductor device according to claim 27, wherein the first insulation film is a laminated film made of different materials and is characterized by the following expression when $d_{si}$ represents a film thickness, $E_{si}$ represents a Young's modulus, and $\alpha_{si}$ represents a coefficient of linear thermal expansion of an i-th insulation film starting from a side of the wiring respectively:

$$d_s = \sum_i d_{si}$$

$$E_s = \left(\sum_i d_{si} E_{si}\right)/d_s$$

$$\alpha_s = \left(\sum_i d_{si} \alpha_{si}\right)/d_s.$$

30. A semiconductor device according to claim 27, wherein the first insulation film has at least one layer of a film having silicon oxide as a main component including an organic material.

31. A semiconductor device according to claim 27, wherein the first insulation film has at least one layer of a film having silicon oxide as a main component including an orgamc content, and the organic material includes methyl group as a main component.

32. A semiconductor device according to claim 27, further comprising:
a substrate, wherein
the wiring is formed on a main surface of the substrate via at least an insulation layer, and
the first insulation film is formed in contact with an upper surface or a lower surface of the wiring.

33. A semiconductor device according to claim 27, further comprising:
a substrate, wherein
the wiring is formed on a main surface of the substrate via at least an insulation layer, and
the first insulation film is formed in contact with an upper surface or a lower surface and side surfaces of the wiring.

34. A semiconductor device according to claim 27, frther comprising:
a substrate, wherein
the wiring is formed on a main surface of the substrate via at least an insulation layer, and
the first insulation film is formed in contact with side surfaces, and upper surface and a lower surface of the wiring.

35. A semiconductor device according to claim 27, wherein the wiring material is Al, the coefficient $k_1$ is equal to 1, and the coefficient $k_2$ is equal to $1.0 \times 10^{-3}$.

36. A semiconductor device according to claim 27, wherein the wiring material is Cu, the coefficient $k_1$ is equal to 1.2, and the coefficient $k_2$ is equal to $1.0 \times 10^{-3}$.

* * * * *

UNITED STATES PATENT AND TRADEMARK OFFICE
CERTIFICATE OF CORRECTION

PATENT NO. : 6,580,171 B2
DATED : June 17, 2003
INVENTOR(S) : Ito et al.

It is certified that error appears in the above-identified patent and that said Letters Patent is hereby corrected as shown below:

Title page,
Item [54], Title, delete "WIRING".

Column 27,
Line 14, after "wiring," insert -- the second interlayer insulation film is an insulation film formed between the first wiring and the second wiring, and --.
Line 28, change "a insulating" to -- an insulating --.

Column 28,
Lines 61-62, change "am, as and ah" to -- $\alpha_M$, $\alpha_S$ and $\alpha_h$ --.

Column 29,
Lines 4-5, change "expression." to -- expression: --.
Line 50, change "ac to comprising:" to -- according to claim 18, further comprising: --.

Column 30,
Line 1, change "seiconductor" to -- semiconductor --.
Line 15, change "a$_S$" to -- $\alpha_S$ --.
Line 66, change "orgamc" to -- organic --.

Signed and Sealed this

Sixteenth Day of December, 2003

JAMES E. ROGAN
*Director of the United States Patent and Trademark Office*